United States Patent
Ching et al.

(10) Patent No.: US 10,910,375 B2
(45) Date of Patent: Feb. 2, 2021

(54) SEMICONDUCTOR DEVICE AND METHOD OF FABRICATION THEREOF

(71) Applicant: TAIWAN SEMICONDUCTOR MANUFACTURING COMPANY, LTD., Hsinchu (TW)

(72) Inventors: Kuo-Cheng Ching, Zhubei (TW); Shi Ning Ju, Hsinchu (TW); Ching-Wei Tsai, Hsinchu (TW); Kuan-Lun Cheng, Hsin-Chu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/147,027

(22) Filed: Sep. 28, 2018

(65) Prior Publication Data
US 2020/0105758 A1    Apr. 2, 2020

(51) Int. Cl.
| | |
|---|---|
| *H01L 27/092* | (2006.01) |
| *H01L 29/66* | (2006.01) |
| *H01L 29/78* | (2006.01) |
| *H01L 29/49* | (2006.01) |
| *H01L 29/51* | (2006.01) |
| *H01L 21/308* | (2006.01) |
| *H01L 21/8238* | (2006.01) |
| *H01L 21/28* | (2006.01) |

(52) U.S. Cl.
CPC .... *H01L 27/0924* (2013.01); *H01L 21/28088* (2013.01); *H01L 21/3086* (2013.01); *H01L 21/823821* (2013.01); *H01L 21/823864* (2013.01); *H01L 29/4966* (2013.01); *H01L 29/517* (2013.01); *H01L 29/66545* (2013.01); *H01L 29/66553* (2013.01); *H01L 29/785* (2013.01)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Raj R Gupta
(74) *Attorney, Agent, or Firm* — Birch, Stewart, Kolasch & Birch, LLP

(57) ABSTRACT

Aspects of the disclosure provide a semiconductor device and a method for forming the semiconductor device. The semiconductor device includes a first transistor formed in a first region of the semiconductor device. The first transistor includes a first channel structure extending between a source terminal and a drain terminal of the first transistor. The first transistor includes a second channel structure that is stacked on the first channel structure in a vertical direction above a substrate of the semiconductor device. Further, the first transistor includes a first gate structure configured to wrap around the first channel structure and the second channel structure with a first metal cap between the first channel structure and the second channel structure. The first metal cap has a different work function from another portion of the first gate structure.

20 Claims, 18 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,112 B2 | 3/2017 | Ching et al. | |
| 2013/0341596 A1* | 12/2013 | Chang | H01L 29/42392 257/29 |
| 2015/0041899 A1* | 2/2015 | Yang | H01L 21/30612 257/351 |
| 2015/0364542 A1* | 12/2015 | Rodder | B82Y 40/00 257/29 |
| 2016/0027929 A1* | 1/2016 | Cheng | H01L 29/78696 257/9 |

\* cited by examiner

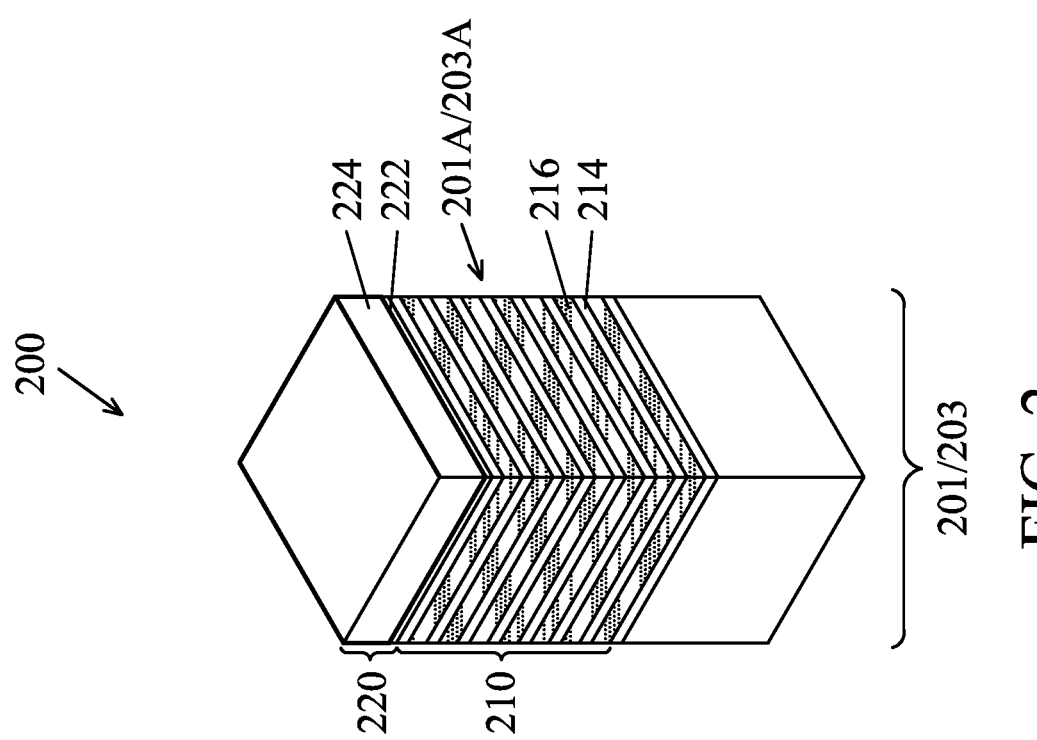

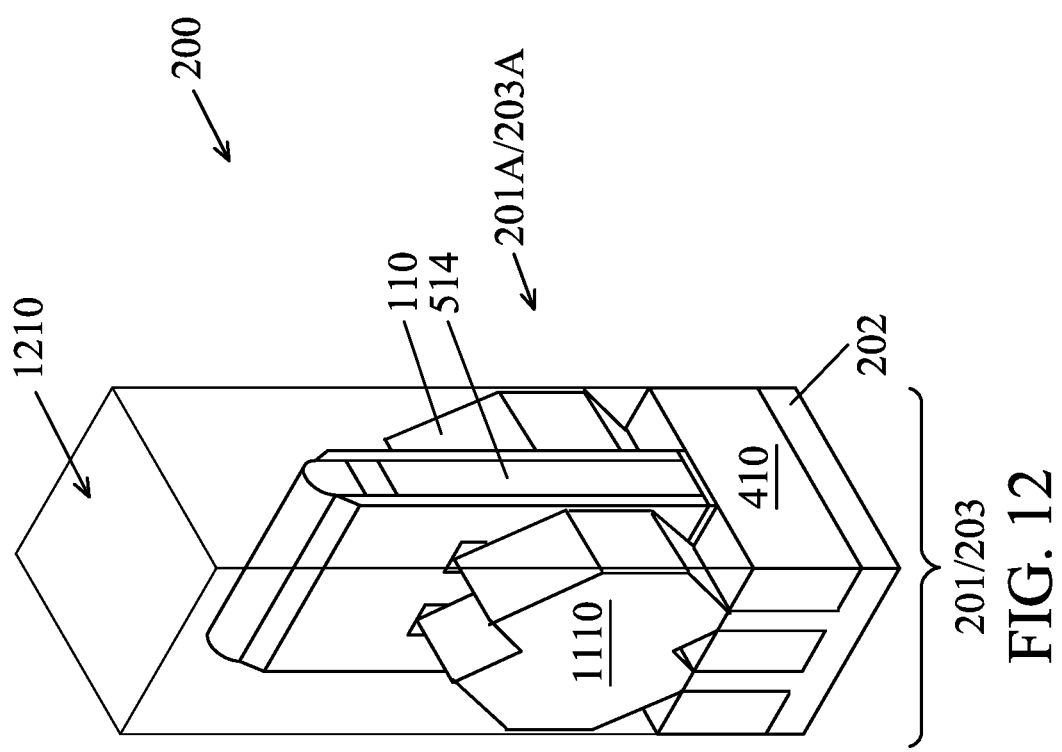

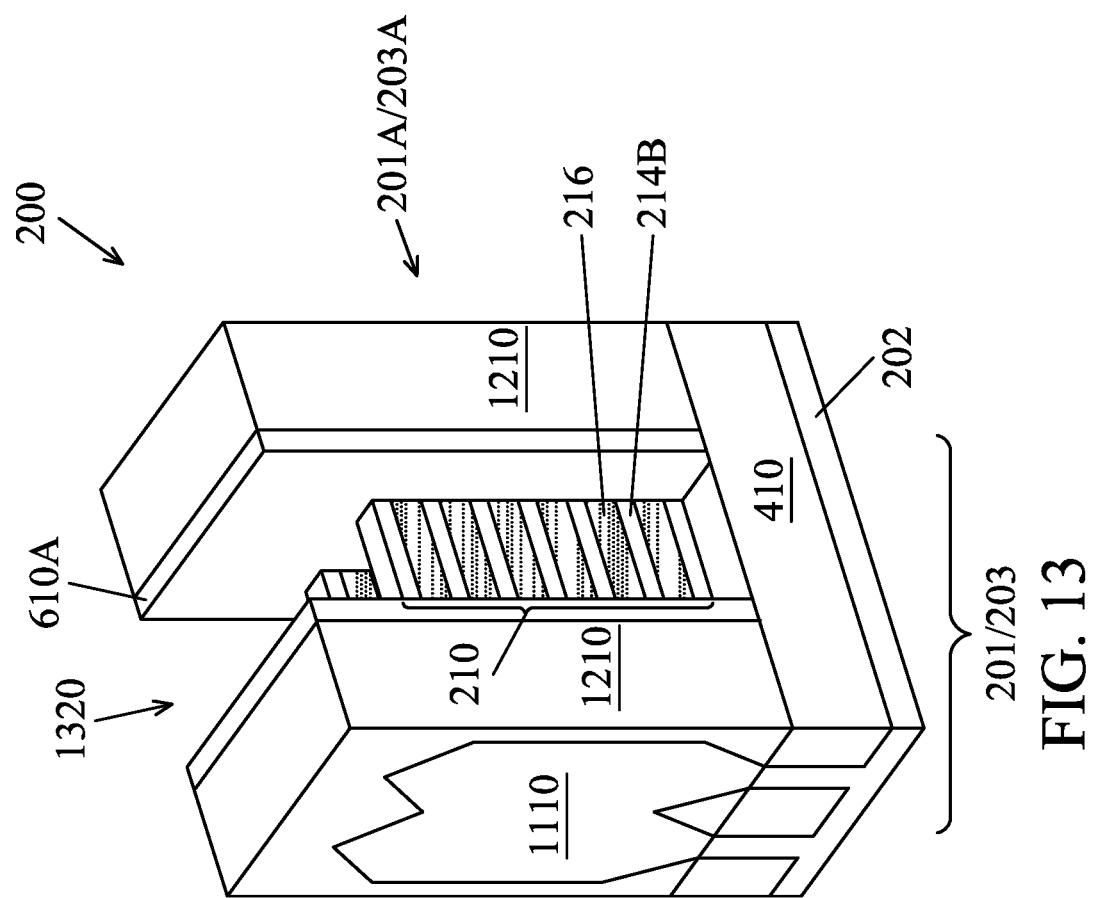

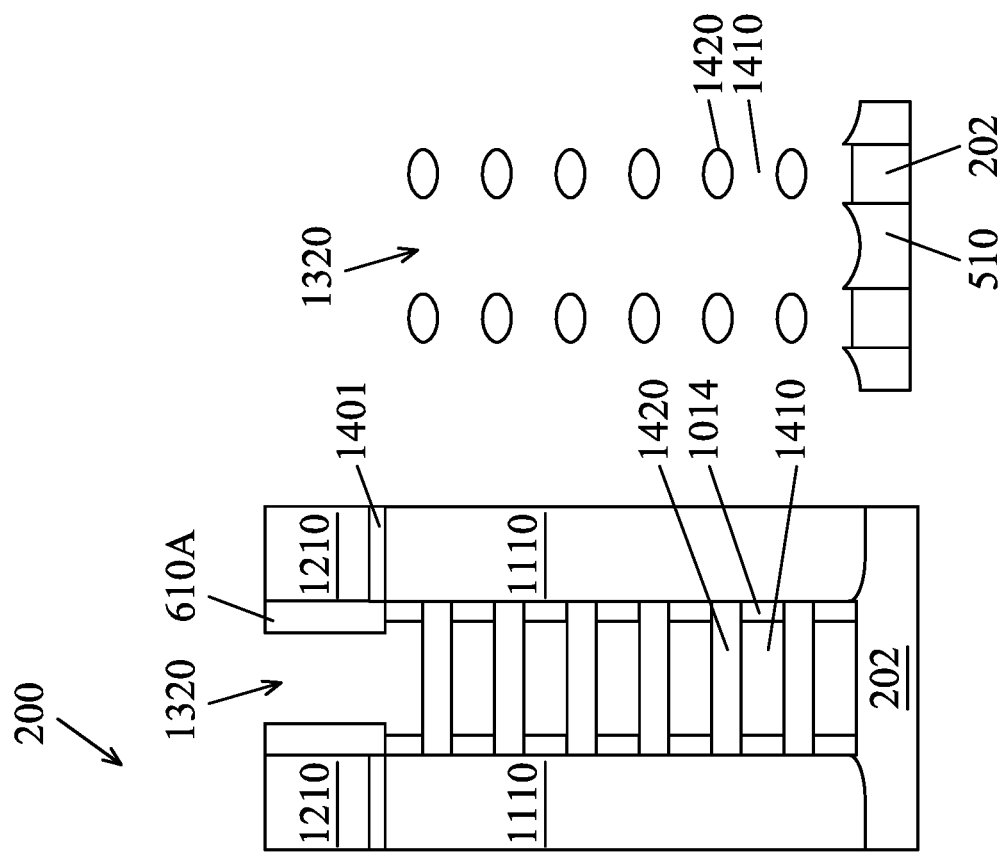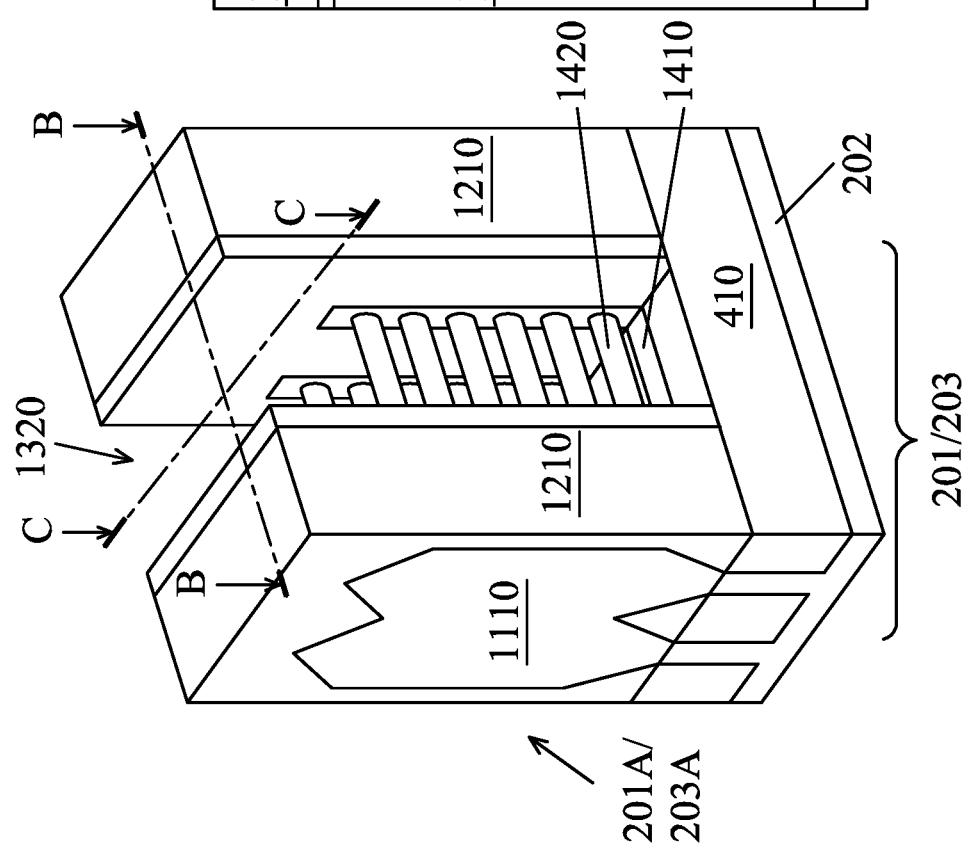

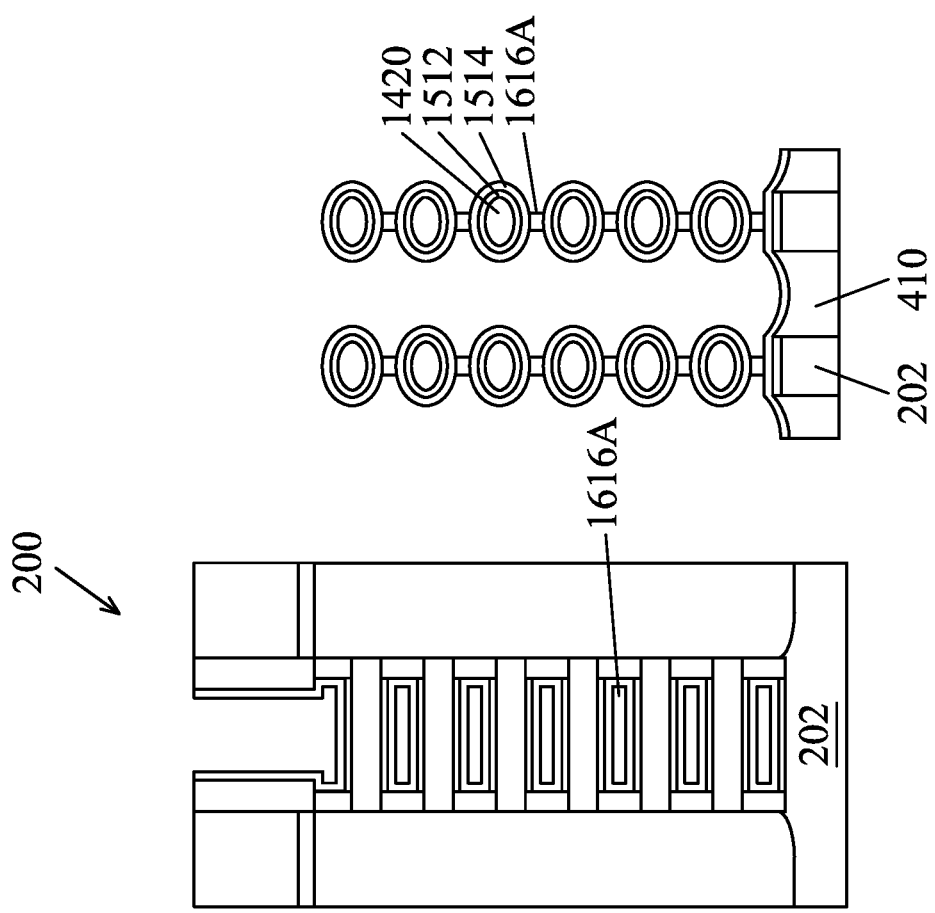
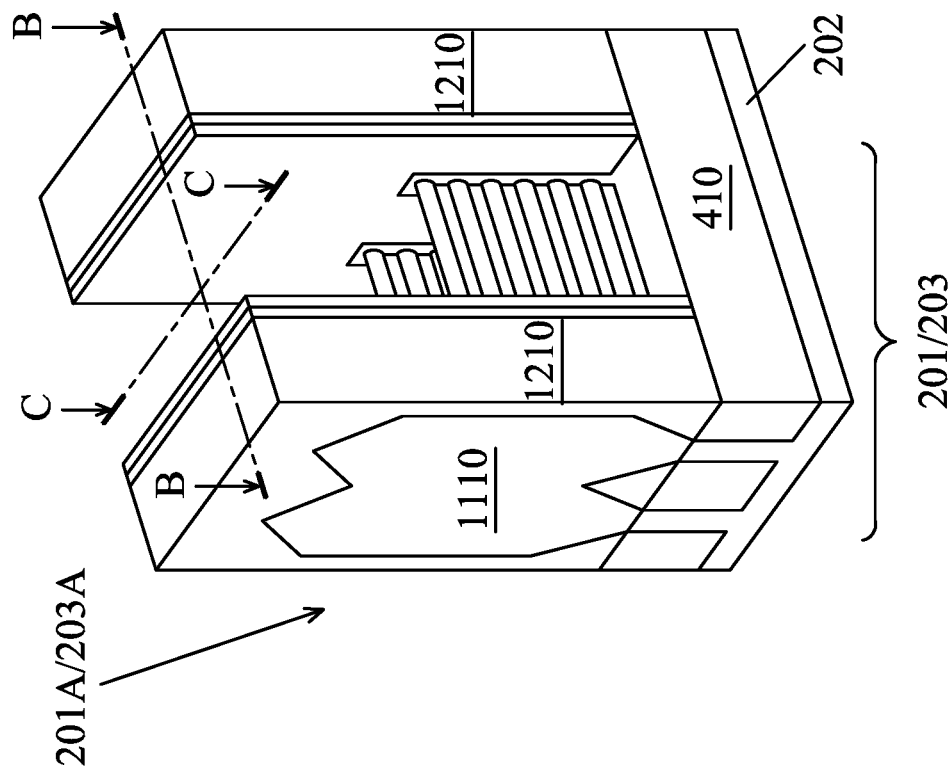
FIG. 17A  FIG. 17B  FIG. 17C

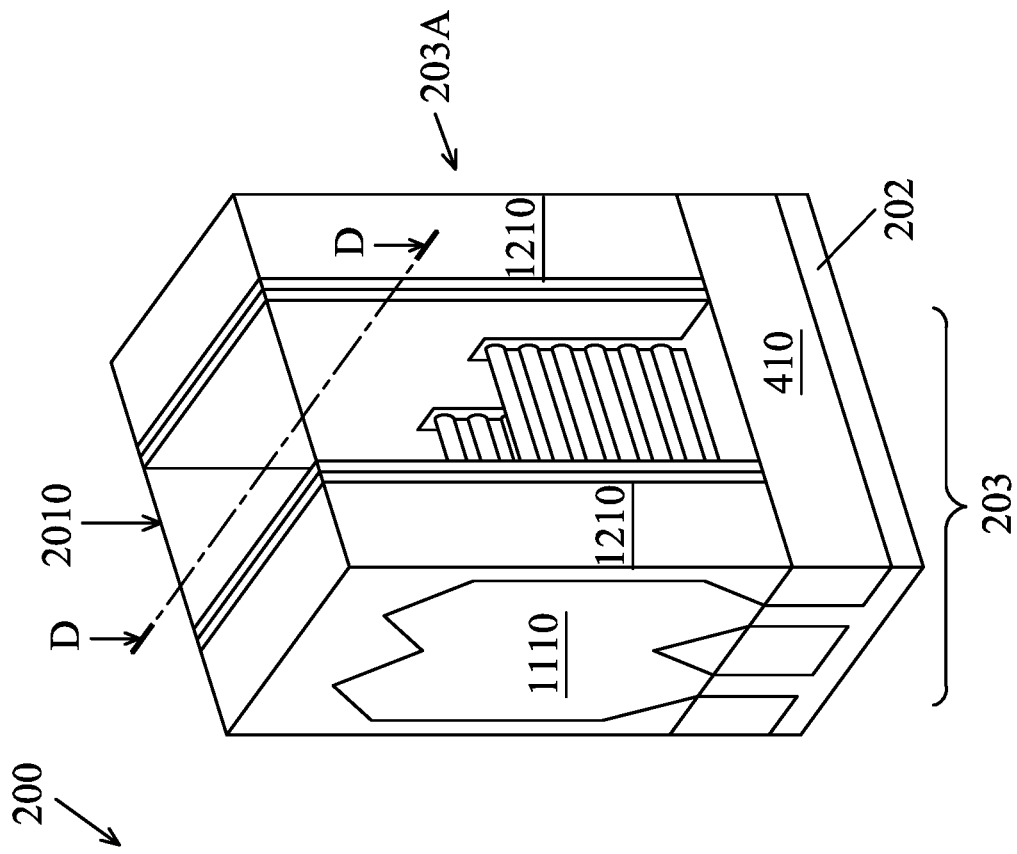
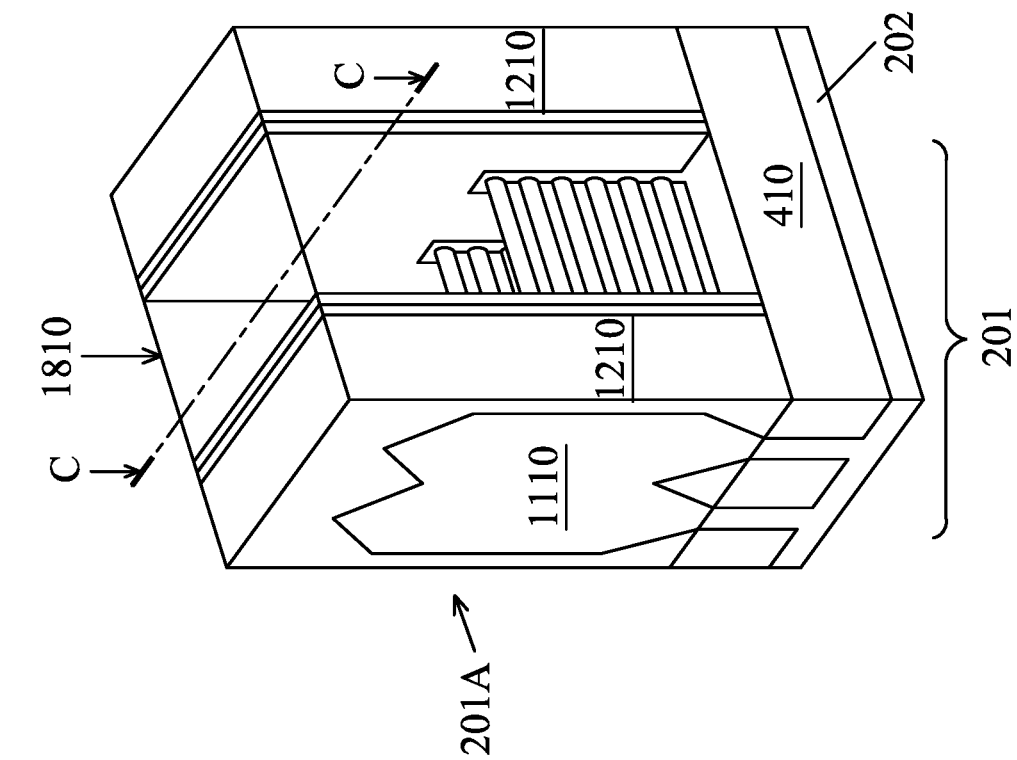
FIG. 21A
FIG. 21B

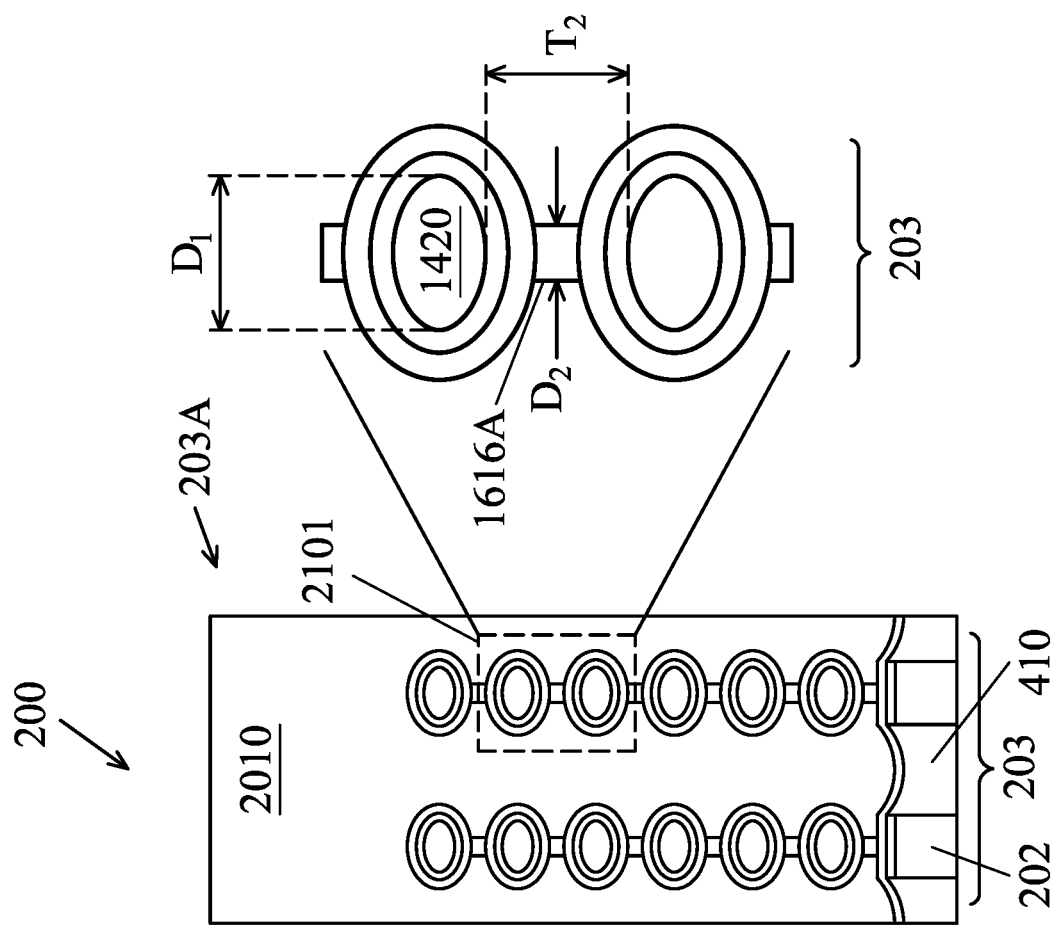
FIG. 21E
FIG. 21D
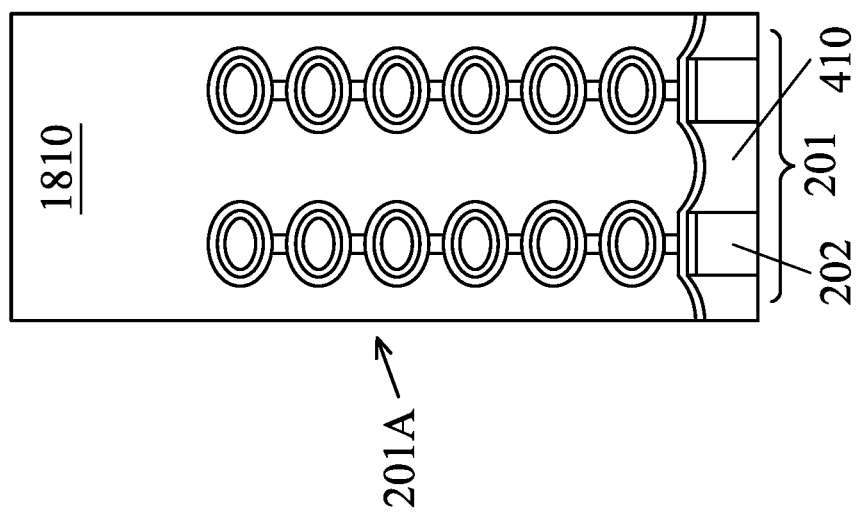
FIG. 21C

SEMICONDUCTOR DEVICE AND METHOD OF FABRICATION THEREOF

BACKGROUND

The electronics industry has experienced an ever increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate transistors have been introduced in an effort to improve gate control by increasing gate channel coupling, reduce OFF-state current, and reduce short-channel effects (SCEs). One such multi-gate transistor is the gate-all around transistor (GAA). In some examples, a gate structure of a GAA transistor wraps around a channel region providing access to the channel on multiple sides. GAA transistors are compatible with complementary metal-oxide-semiconductor (CMOS) processes and their structure allows them to be aggressively scaled while maintaining gate control and mitigating SCEs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-13 show various isometric views of a semiconductor device 200 in accordance with some embodiments of the disclosure;

FIG. 14A shows an isometric view of the semiconductor device 200 in accordance with an embodiment of the disclosure;

FIGS. 14B and 14C show cross-section views, corresponding to the isometric view of FIG. 14A along line B-B and line C-C, respectively, of the semiconductor device 200 in accordance with an embodiment of the disclosure;

FIG. 17A shows an isometric view of the semiconductor device 200 in accordance with an embodiment of the disclosure;

FIGS. 17B and 17C show cross-section views, corresponding to the isometric view of FIG. 17A along line B-B and line C-C, respectively, of the semiconductor device 200 in accordance with an embodiment of the disclosure;

FIGS. 21A and 21B show an isometric view of the first transistor 201A and the second transistor 203A, respectively, in accordance with an embodiment of the disclosure;

FIG. 21C shows a cross-section view, corresponding to the isometric view of FIG. 21A along line C-C, of the first transistor 201A in accordance with an embodiment of the disclosure;

FIG. 21D shows a cross-section view, corresponding to the isometric view of FIG. 21B along line D-D, of the second transistor 203A in accordance with an embodiment of the disclosure; and FIG. 21E shows an enlarged cross-section view of an area 2101 in FIG. 21D in accordance with an embodiment of the disclosure.

DETAILED DESCRIPTION

Figure 1:
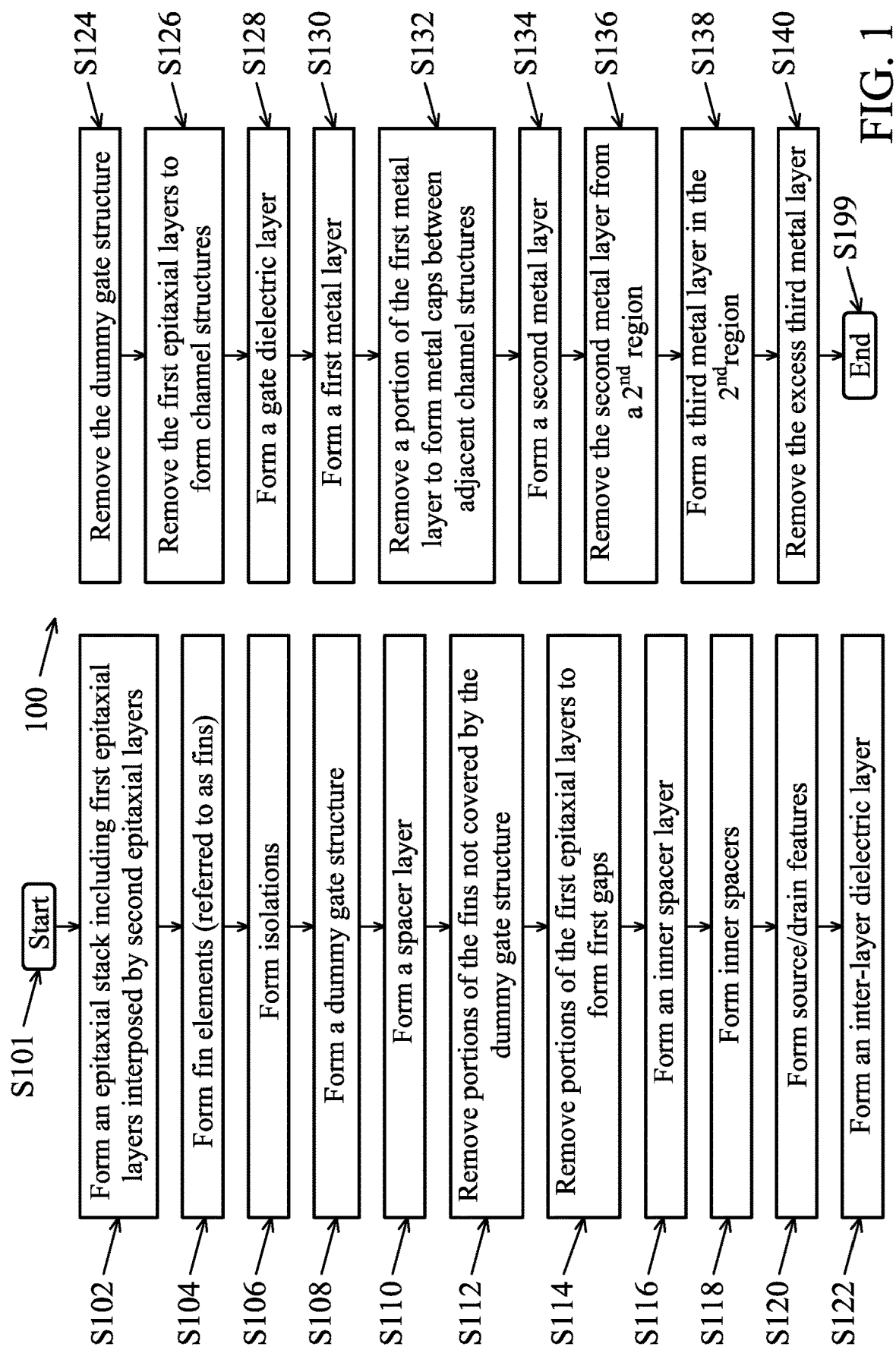
FIG. 1 shows a flow chart outlining a process 100 in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide a semiconductor device that includes a first transistor. The first transistor includes multiple channel structures and a gate structure that wraps around each of the multiple channel structures. The gate structure includes a first metal component that provides a suitable work function to determine a threshold voltage of the first transistor, and a second metal component that is used to form a metal cap between adjacent channel structures. The metal cap is formed to facilitate formation of the gate structure with the first metal component. In some embodiments, the metal cap can facilitate a removal of another metal component that is used to form a gate structure for a second transistor during a process to form respective gate structures for the first transistor and the second transistor. The first transistor and the second transistor have different threshold voltages, and are formed with different metal components that provide different work functions. In some embodiments, the metal cap has a different work function from the first metal component.

According to the disclosure, the first transistor and the second transistor are formed with a semiconductor material in a channel region between respective source regions and drain regions. For example, under control from a gate terminal of the first transistor (or the second transistor), the semiconductor material forms a channel between the source region and the drain region. The semiconductor material is characterized by a valence band and a conduction band with a bandgap between the valence band and the conduction band. When a metal has a work function near the valence band or the conduction band, the metal is referred to as a band-edge work function metal. When a metal has a work function near the middle of the bandgap, the metal is referred to as a mid-gap work function metal. In some embodiments, the metal cap is formed with a mid-gap work function metal and the first metal component is formed with a band-edge work function metal.

FIG. 1 shows a flow chart outlining a process 100 for semiconductor fabrication according to an embodiment of the disclosure. The process 100 is used to fabricate a multi-gate transistor in a semiconductor device 200. As used herein, a semiconductor device refers to for example, one or more transistors, integrated circuits, a semiconductor chip (e.g., memory chip, logic chip on a semiconductor die), a stack of semiconductor chips, a semiconductor package, a semiconductor wafer, and the like. The term "multi-gate transistor" refers to a transistor, such as a field effect transistor (FET) that has gate material(s) disposed on multiple sides of a channel structure of the transistor. In some examples, the multi-gate transistor is referred to as a gate-all around (GAA) transistor when gate material(s) are disposed on at least four sides of a channel structure of the multi-gate transistor. In some examples, the channel structure is referred to as a 'nanowire', a 'nanosheet', and the like that as used herein includes channel structures of various geometries (e.g., cylindrical, bar-shaped) and various dimensions.

FIGS. 2-13, 14A, 15A, 16A, 17A, and 18-21B, are isometric views of a portion of a semiconductor device 200 at various steps of the process 100 according to some embodiments of the disclosure. FIGS. 14B, 14C, 15B, 15C, 16B, 16C, 17B, 17C, and 21C-21E, are cross-sectional views, corresponding to respective isometric views listed above, of the semiconductor device 200 at the various steps of the process 100 according to some embodiments of the disclosure.

In some embodiments, the process 100 is used during wafer manufacturing to form GAA transistors on the semiconductor device 200. It is noted that the process 100 can be modified from a CMOS technology process flow, thus some of the steps of the process 100 are used in the CMOS technology process flow and are briefly described herein. It is also noted that the process 100 can be combined with other process flows to manufacture other suitable semiconductor components (not shown), such as other types of transistors, bipolar junction transistors, resistors, capacitors, inductors, diodes, fuses, static random access memory (SRAM), and the like on the semiconductor device 200. In an example, the GAA transistors and the other semiconductor components are integrated as integrated circuits. Moreover, it is noted that the steps of the process 100, including any descriptions given with reference to FIGS. 2-21, are merely exemplary and are not intended to be limiting beyond what is specifically recited in the claims that follow.

According to the present disclosure, a first multi-gate transistor 201A (or first transistor 201A) is formed in a first region 201 of the semiconductor device 200 and a second multi-gate transistor 203A (or second transistor 203A) is formed on a second region 203 using the process 100. The first transistor 201A has a first threshold voltage $V_{t1}$, and the second transistor 203A has a second threshold voltage $V_{t2}$. It is noted that various fabrication methods can be suitably modified according to the present disclosure to fabricate semiconductor devices with similar transistor structures as the first transistor 201A and/or the second transistor 203A without departing from the spirit and scope of the present disclosure.

Referring to FIGS. 1 and 2, the process 100 starts at S101, and proceeds to S102. At S102, an epitaxial stack 210 is formed over a substrate 202 of the semiconductor device 200. The epitaxial stack 210 includes first epitaxial layers 214 of a first composition interposed by second epitaxial layers 216 of a second composition. In an embodiment, the first composition and the second composition are different. For example, the first epitaxial layers 214 are formed of silicon germanium (SiGe) and the second epitaxial layers 216 are formed of silicon (Si).

The substrate 202 can be any suitable substrate, and can be processed with various features. In an embodiment, the substrate 202 is a semiconductor substrate, such as a silicon substrate. In another embodiment, the substrate 202 includes various layers, including conductive or insulating layers formed on a semiconductor substrate. In an embodiment, the substrate 202 includes various doping configurations depending on design requirements. For example, different doping profiles (e.g., n wells, p wells) are formed on the substrate 202 in regions designed for different transistor types, such as a n-type FET (NFET), a p-type FET (PFET), and the like. The doping profiles can be formed using any suitable process, such as ion implantation of dopants and/or diffusion processes. The substrate 202 has isolations, such as shallow trench isolations (STIs), and the like interposing respective regions providing different transistor types, in an example. In an embodiment, the substrate 202 is formed of any suitable semiconductor material, such as germanium, silicon carbide (SiC), SiGe, diamond, a compound semiconductor, an alloy semiconductor, and the like. In another embodiment, the substrate 202 includes an epitaxial layer formed on insulator.

It is noted that seven (7) layers of the first epitaxial layers 214 and six (6) layers of the second epitaxial layers 216 are illustrated in FIG. 2 for illustrative purposes only and not intended to be limiting. Any suitable number of epitaxial layers can be formed in the epitaxial stack 210, the number of epitaxy layers depends on a desired number of channel structures for respective transistors. In some embodiments, the number of second epitaxial layers 216 is between 2 and 10, for example, to form a stack of 2 to 10 channel structures.

In some embodiments, each of the first epitaxial layers 214 has a thickness range of about 2 nanometers (nm) to about 10 nm. In some examples, each of the first epitaxial layers 214 has a thickness range of about 4 nm to about 10 nm. In an example, each of the first epitaxial layers 214 has a relatively uniform thickness. The first epitaxial layers 214 can have same thickness or different thicknesses. In some embodiments, each of the second epitaxial layers 216 has a thickness range of about 5 nm to about 12 nm. In an example, each of the second epitaxial layers 216 is substantially uniform in thickness. The second epitaxial layers 216 can have same thickness or different thicknesses. In some embodiments, the second epitaxial layers 216 are thicker than the first epitaxial layers 214. As described in more detail below, in an example, channel structures of a transistor are respectively formed using the second epitaxial layers 216. In an example, the thickness of the second epitaxial layers 216 is chosen based on, for example, manufacturing considerations, transistor performance considerations, and the like. In an example, the thickness of the first epitaxial layers 214 are used to define a space between adjacent channel structures, and the respective thickness of the first epitaxial layers 214 is chosen based on, for example, manufacturing considerations, transistor performance considerations, and the like.

By way of example, forming the epitaxial stack 210 may be performed by a molecular beam epitaxy (MBE) process, a metalorganic chemical vapor deposition (MOCVD) process, and/or other suitable epitaxial growth processes. In some embodiments, the epitaxially grown layers, such as the second epitaxial layers 216, include the same material as the substrate 202. In some embodiments, the first and second epitaxial layers, 214 and 216, include a different material than the substrate 202. As described above, in some examples, the first epitaxial layer 214 includes an epitaxially grown SiGe layer and the second epitaxial layer 216 includes epitaxially grown Si layer. Alternatively, in some embodiments, either of the first and second epitaxial layers, 214 and 216, include other materials such as germanium, a compound semiconductor such as SiC, gallium arsenide, gallium phosphide, indium phosphide, indium arsenide, and/or indium antimonide, an alloy semiconductor such as SiGe, GaAsP, AlInAs, AlGaAs, InGaAs, GanP, and/or GaInAsP, or combinations thereof. As described above, the materials of the first and second epitaxial layers, 214 and 216, may be chosen based on providing differing etch selectivity properties. In various embodiments, the first and second epitaxial layers, 214 and 216, are substantially dopant-free (i.e., having an extrinsic dopant concentration less than about $1 \times 10^{17}$ cm$^{-3}$), for example, no intentional doping is performed during the epitaxial growth process.

As also shown in the example of FIG. 2, a hardmask (HM) layer 220 is formed over the epitaxial stack 210. In some embodiments, the HM layer 220 includes an oxide layer 222 (e.g., a pad oxide layer of $SiO_2$) and nitride layer 224 (e.g., a pad nitride layer of $Si_3N_4$) formed over the oxide layer 222. In some examples, the oxide layer 222 includes thermally grown oxide, chemical vapor deposition (CVD) deposited oxide, and/or atomic layer deposition (ALD) deposited oxide. In some embodiments, the nitride layer 224 includes a nitride layer deposited by CVD or other suitable technique. The HM layer 220 is used to protect portions of the substrate 202 and/or the epitaxial stack 210 and/or is used to define a pattern (e.g., fin elements) as described below.

Figure 3:
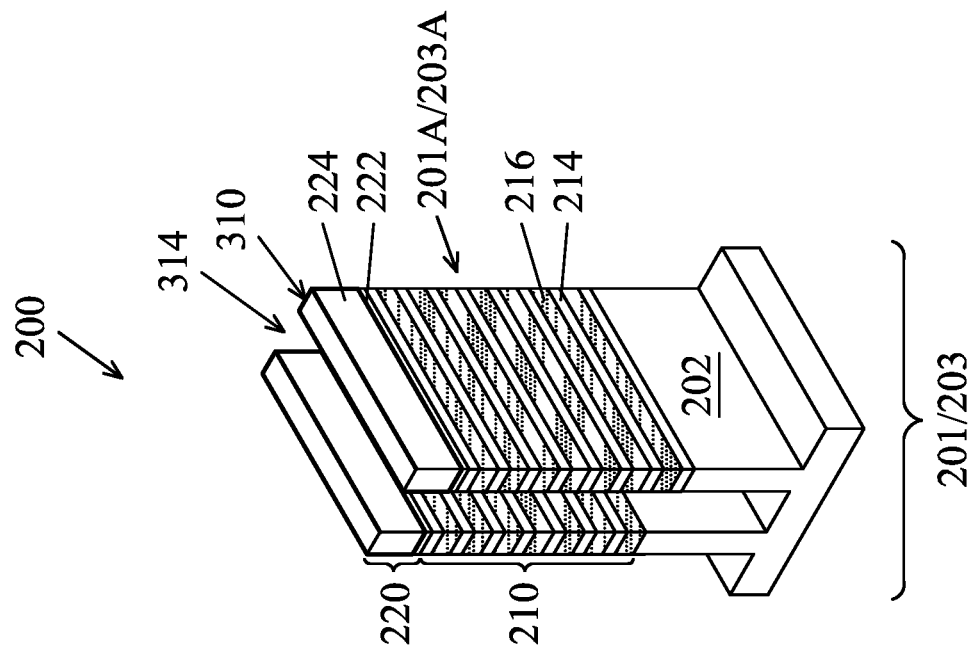

Referring to FIGS. 1 and 3, the process 100 proceeds to S104 by forming a plurality of fin elements 310 (referred to as fins) extending from the substrate 202 (such as shown in the first and second regions, 201 and 203). In various embodiments, each of the fins 310 includes a portion formed from the substrate 202, a portion of the epitaxial stack 210, and a portion of the HM layer 220. The portion of the epitaxial stack 210 includes portions of the first epitaxial layers 214 and the second epitaxial layers 216.

In some embodiments, the fins 310 are fabricated using suitable processes including photolithography and etch processes. During a photolithography process, in an example, a photoresist layer is formed (e.g., spun) over the surface of the semiconductor device 200, for example, over the HM layer 220 of FIG. 2. Then, the photoresist layer is exposed according to a mask of patterns, and is developed to form the patterns in the photoresist layer. The photoresist layer with the patterns can be used as a masking element to pattern other layers. In some embodiments, patterning the photoresist layer to form the masking element is performed using an electron beam (e-beam) lithography process. The masking element is then used to protect regions of the substrate 202, and layers formed thereupon, while an etch process forms trenches 314 in unprotected regions through the HM layer 220, through the epitaxial stack 210, and into the substrate 202, thereby leaving the fins 310. In some examples, the trenches 314 is formed using a dry etch (e.g., reactive ion etching), a wet etch, and/or combination thereof.

Numerous other embodiments of methods to form fins on a substrate can also be used. In an example, a method to form fins can include defining a fin region (e.g., by mask or isolation regions) and epitaxially growing the epitaxial stack 210 in the form of the fins 310. In some embodiments, forming the fins 310 includes a trim process to decrease widths of the fins 310. The trim process includes wet and/or dry etching processes.

Figure 4:
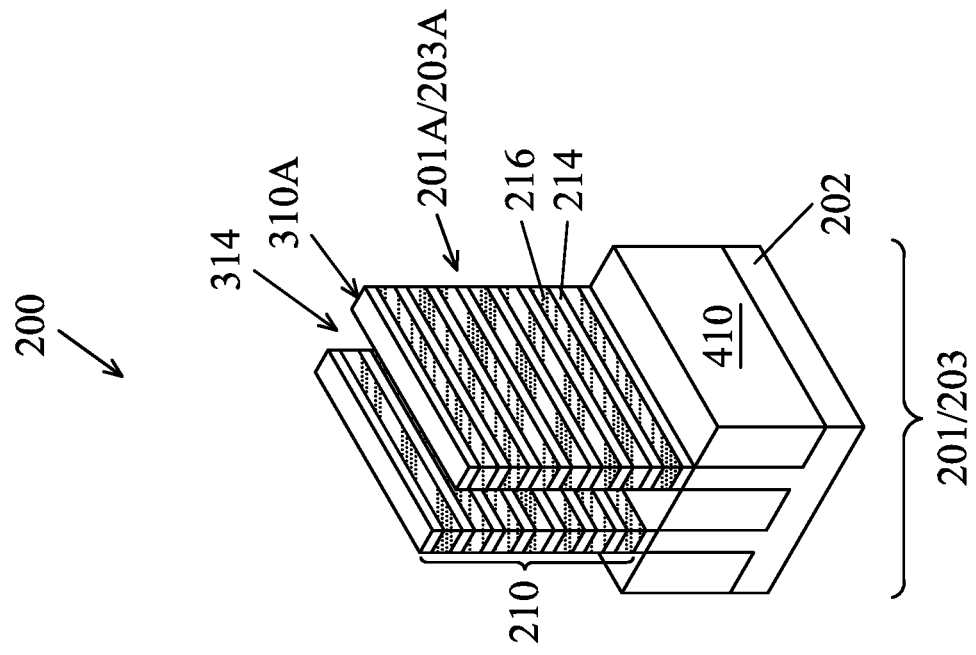

Referring to FIGS. 1 and 4, the process 100 proceeds to S106 by forming isolations, such as STIs, between the fins 310 (such as shown in the first and second regions, 201 and 203). By way of example, in some embodiments, a dielectric layer of dielectric materials is first deposited over the substrate 202, filling the trenches 314 with the dielectric material. In some embodiments, the dielectric layer may include $SiO_2$, silicon nitride, silicon oxynitride, fluorine doped silicate glass (FSG), a low dielectric constant (low-k dielectric) material, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the semiconductor device 200 is annealed, for example, to improve quality of the dielectric layer. In some embodiments, the dielectric layer (and the subsequently formed STIs) includes a multi-layer structure, for example, having one or more liner layers.

In an example to form the STIs, after deposition of the dielectric layer, the dielectric material is thinned and planarized, for example, by a chemical mechanical polishing (CMP) process. The CMP process planarizes the top surface of the dielectric layer. In some embodiments, the CMP process also removes the HM layer 220 from each of the fins 310. In some embodiments, removal of the HM layer 220 is performed by using a suitable etching process (e.g., a dry or a wet etching process).

The process 100 further includes recessing the STIs interposing the fins 310 to provide the fins 310 extending above the recessed STIs 410 (such as shown in the first and second regions, 201 and 203). In some embodiments, the recessing process includes a dry etching process, a wet etching process, and/or a combination thereof. In some embodiments, a recessing depth is controlled (e.g., by controlling an etching time) so as to result in a desired height of the exposed upper portion of the fins 310, referred to as upper fins 310A. In some embodiments, the height exposes each of the first and second epitaxy layers 214 and 216 of the epitaxial stack 210.

Figure 5:
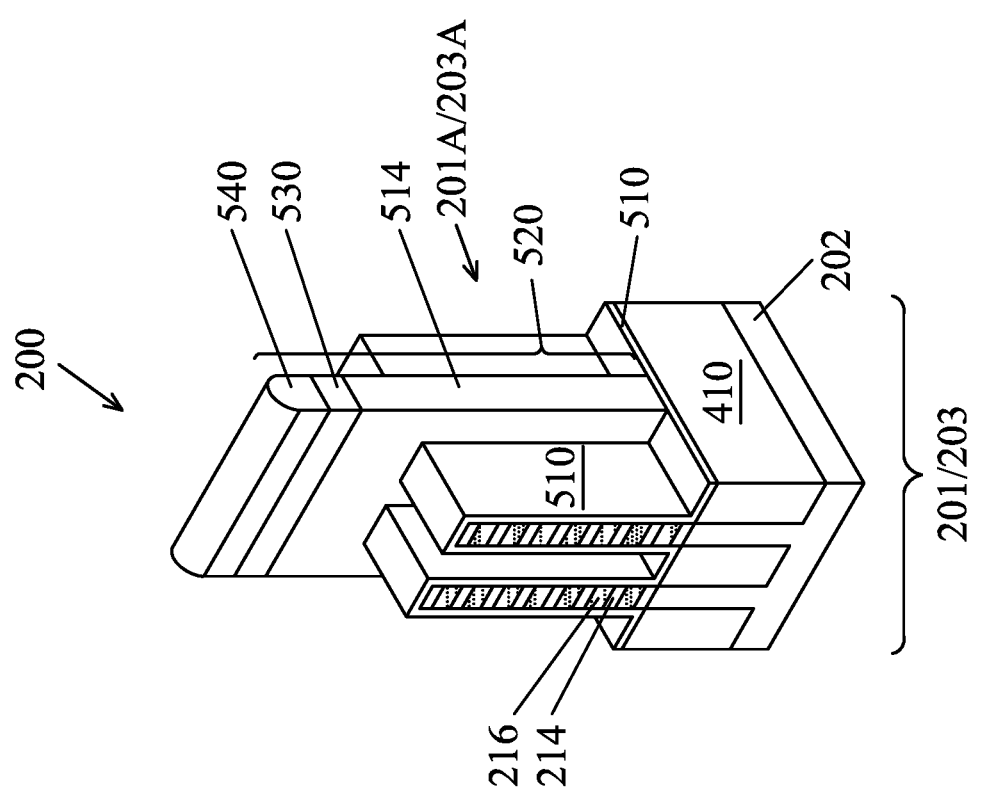

Referring to FIGS. 1 and 5, the process 100 proceeds to S108 by forming a dummy gate structure 520 over the upper fins 310A (such as shown at the first and second regions, 201 and 203). In some embodiments, the dummy gate structure 520 is replaced by a final gate structure at subsequent processing steps of the process 100. In some embodiments, the dummy gate structure 520 is formed over the substrate 202 and is at least partially disposed over the upper fins 310A. Portions of the upper fins 310A underlying the dummy gate structure 520 are referred to as channel regions.

In some embodiments, the dummy gate structure 520 includes a dummy dielectric layer 510, an electrode layer 514, a HM layer 530, and a photoresist layer 540. In some embodiments, the dummy gate structure 520 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the dummy gate structure 520 for example, the patterning process includes a lithography process (e.g., photolithography or e-beam lithography) that may further include photoresist coating (e.g., spin-on coating), soft baking, mask aligning, exposure, post-exposure baking, photoresist developing, rinsing, drying (e.g., spin drying and/or hard baking), other suitable lithography techniques, and/or combinations thereof. In some embodiments, the etching process may include dry etching (e.g., reactive ion etching), wet etching, and/or other etching methods.

In the present disclosure, the dummy dielectric layer 510 is formed over the upper fins 310A. In some embodiments, the dummy dielectric layer 510 includes $SiO_2$, silicon nitride, a high dielectric constant (high-K) dielectric material and/or other suitable material. In some embodiments, the dummy dielectric layer 510 includes multiple layers. In various examples, the dummy dielectric layer 510 may be deposited by a CVD process, a SACVD process, a flowable CVD process, an ALD process, a PVD process, or other suitable process. By way of example, the dummy dielectric layer 510 is used to prevent damage to the upper fins 310A by subsequent processing.

In some embodiments, the dummy dielectric layer 510 is not included in the dummy gate structure 520, for example, being removed prior to the deposition of the electrode layer 514. In some embodiments, an additional dielectric layer is included in the dummy gate structure 520. In some examples, the additional dielectric layer includes silicon nitride, a high-K dielectric material or other suitable material. In some embodiments, the electrode layer 514 includes polycrystalline silicon (polysilicon). In some embodiments, the HM layer 530 includes an oxide layer such as a pad oxide layer of $SiO_2$. In some embodiments, the HM layer 530 includes the nitride layer such as a pad nitride layer that includes $Si_3N_4$, silicon oxynitride and/or silicon carbide. In some embodiments, the HM layer 530 includes multiple layers (e.g., an oxide layer and a nitride layer, as described above).

Figure 6:
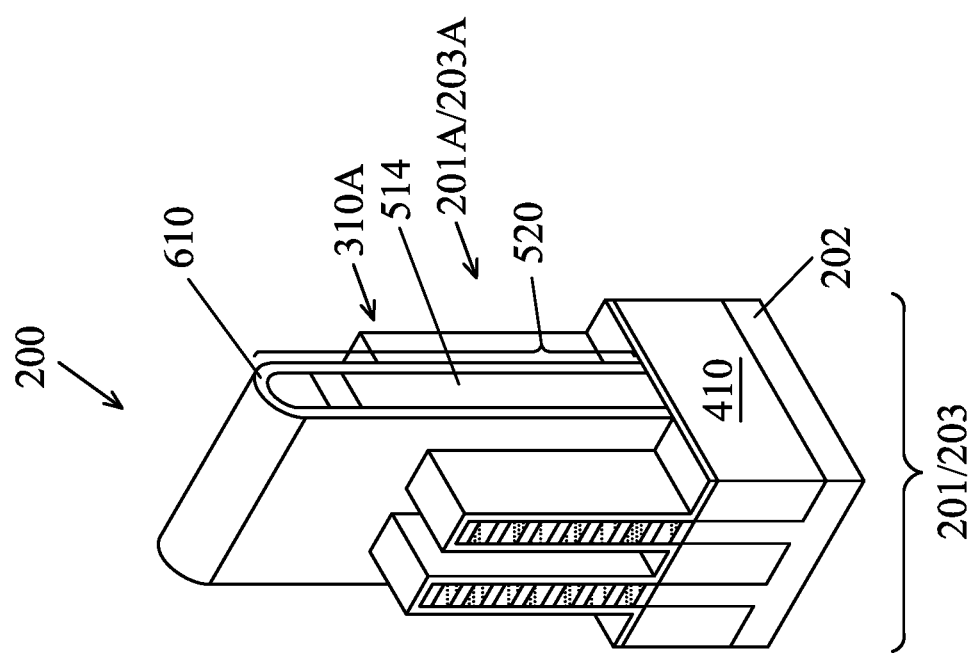

Referring to FIGS. 1 and 6, the process 100 proceeds to S110 by forming a spacer layer 610 over the substrate 202 (as shown in the first and second regions, 201 and 203). In some embodiments, the spacer layer 610 is a conformal dielectric layer formed over the substrate 202. The spacer layer 610 forms spacer elements on sidewalls of the dummy gate structure 520.

In some embodiments, the spacer layer 610 includes a dielectric material such as silicon oxide, silicon nitride, silicon carbide, silicon oxynitride, SiCN, silicon oxycarbonitride (SiOCN), and/or combinations thereof. In some examples, the spacer layer 610 includes multiple layers, such as main spacer walls, liner layers, and the like. By way of an example, the spacer layer 610 is formed by depositing a dielectric material over the dummy gate structure 520 using processes such as, CVD process, a SACVD process, a flowable CVD process, an ALD process, a PVD process, or other suitable process. In some embodiments, the deposition is followed by an etching-back (e.g., anisotropically) of the dielectric material.

Figure 7:
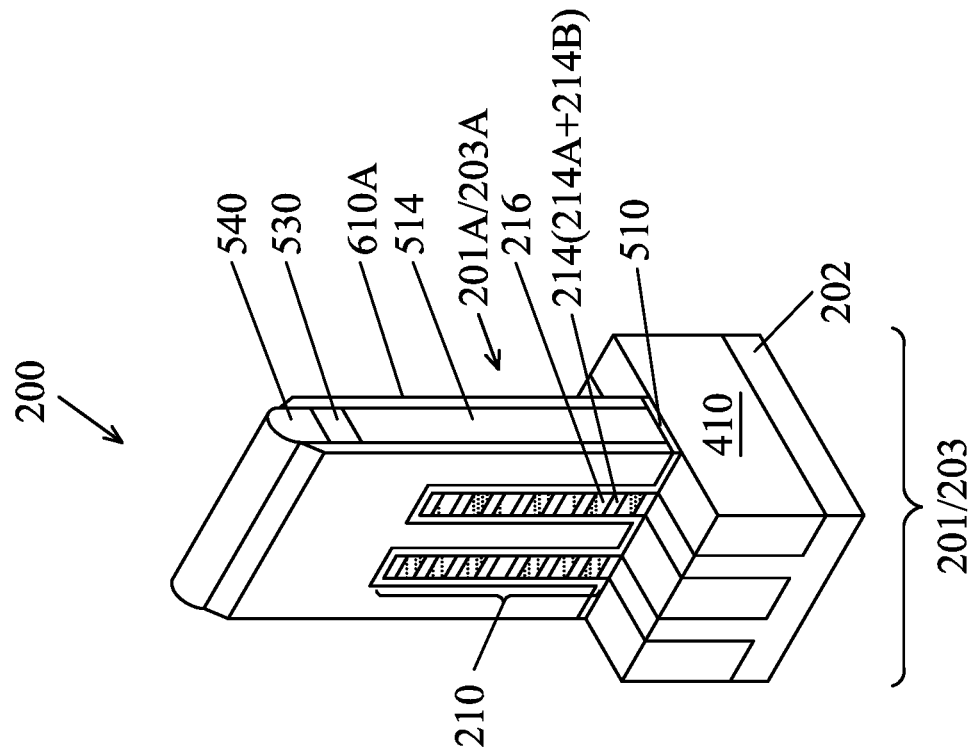

Referring to FIGS. 1 and 7, the process 100 proceeds to S112 by removing portions of the upper fins 310A that are adjacent the channel regions underlying the dummy gate structure 520 using an etch process (as shown in the first and second regions, 201 and 203). In some embodiments, the spacer layer 610 and the dummy dielectric layer 510 are removed from exposed regions of the substrate 202 not covered by the dummy gate structure 520. As shown in FIG. 7, a portion of the spacer layer 610 that is shown as spacer elements 610A remains on the sidewalls of the dummy gate structure 520. In some embodiments, the first epitaxial layers 214 includes two portions, first portions 214A that underlie the spacer elements 610A and are not covered by the dummy gate structure 520 and second portions 214B that are covered by the dummy gate structure 520. The etch process may include a dry etch (e.g., reactive ion etching), a wet etch, and/or a combination thereof.

Figure 8:
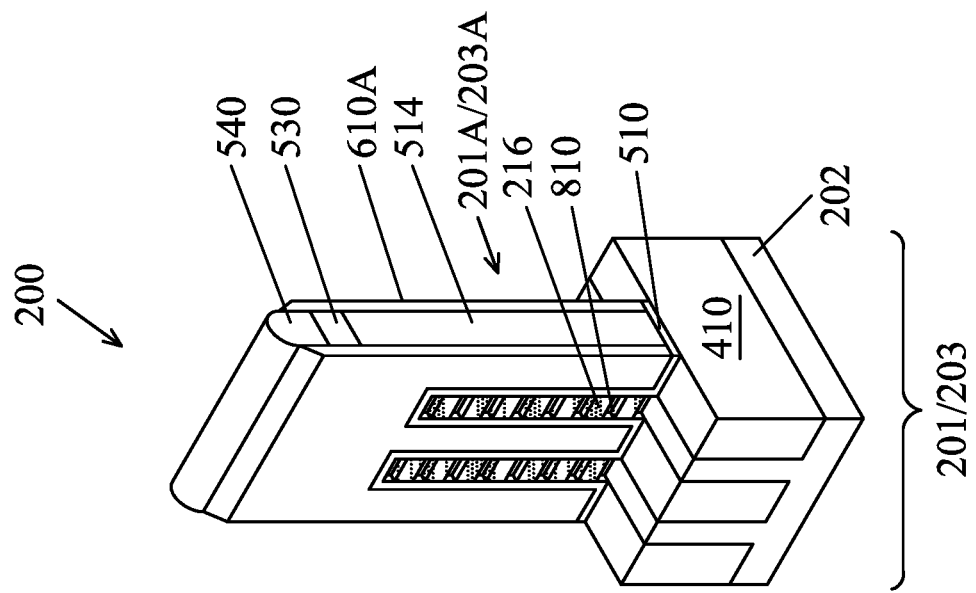

Referring to FIGS. 1 and 8, the process 100 proceeds to step 114 by removing the first portions 214A of the first epitaxial layers 214 to form first gaps 810 between the second epitaxial layers 216 (as shown in the first and second regions, 201 and 203). Removing the first portions 214A of the first epitaxial layers 214 can be performed by a suitable etch process, such as a wet etch, a dry etch, and/or a combination thereof. The etch process is chosen to selectively etch the first epitaxial layers 214 without substantially etching the second epitaxial layers 216. In some examples, the second portions 214B of the first epitaxial layers 214 in the channel region remain.

FIG. 8 illustrates the first gaps 810 in place of the removed first portions 214A of the first epitaxial layers 214. The first gaps 810 are filled with the ambient environment (e.g., air, $N_2$). In an embodiment, the first portions 214A of the first epitaxial layers 214 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation is provided by $O_3$ clean and then SiGeOx is removed by an etchant such as $NH_4OH$. In an embodiment, the first epitaxial layers 214 are SiGe and the second epitaxial layers 216 are silicon allowing for the selective removal of the first portions 214A of the first epitaxial layers 214.

Figure 9:
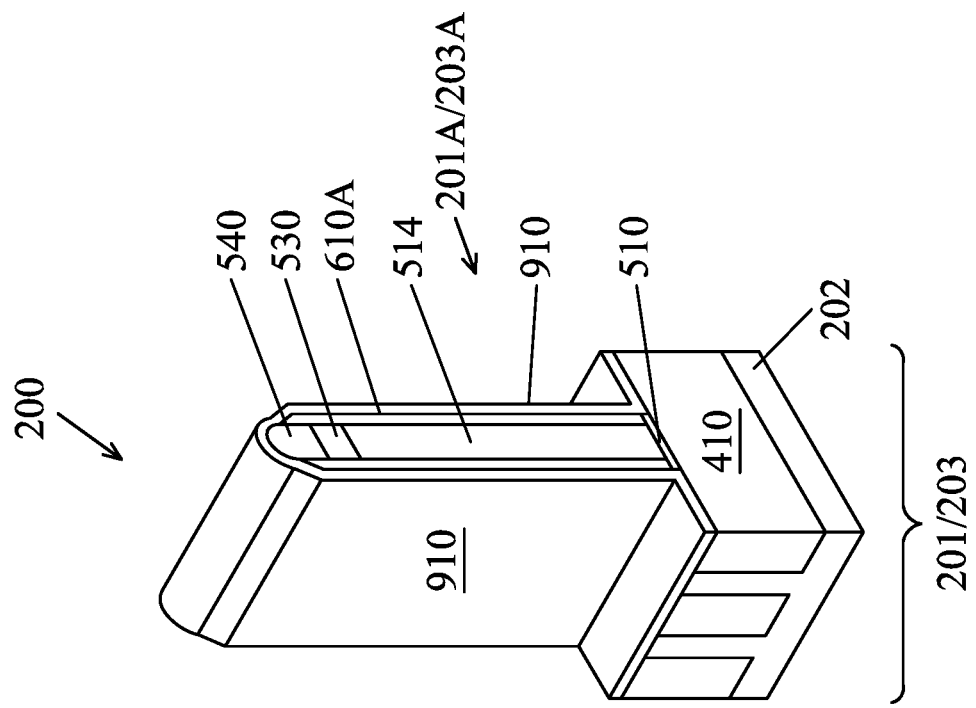

Referring to FIGS. 1 and 9, the process 100 proceeds to S116 by forming an inner spacer layer 910 over the substrate 202 (such as shown in the first and second regions, 201 and 203). In an example, the inner spacer layer 910 is a conformal dielectric layer formed over the substrate 202. In some embodiments, the inner spacer layer 910 wraps around the spacer elements 610A, and fills the first gaps 810.

In some examples, the inner spacer layer 910 includes a dielectric material such as silicon oxide, silicon nitride, and/or combinations thereof. In some embodiments, the inner spacer layer 910 includes multiple layers. In some embodiments, the inner spacer layer 910 is formed similarly in many respects to the spacer layer 610 described above in FIG. 6.

Figure 10:
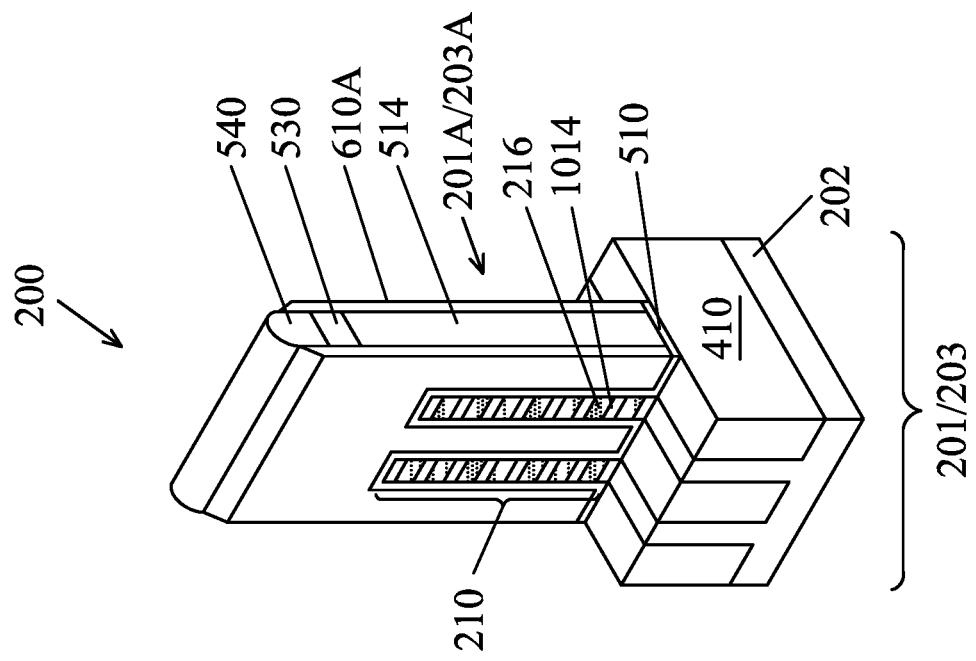

Referring to FIGS. 1 and 10, the process 100 proceeds to S118 by removing portions of the inner spacer layer 910 (as shown in the first and second regions, 201 and 203) that are exposed outside the spacer elements 610A. The inner spacer 910 is removed from a top surface and sidewalls of the dummy gate structure 520 as well as from the substrate 202 and the STI features 410, but portions of the inner spacer 910 in the spacer elements 610A remain between the second epitaxy layers 216 as shown by remaining inner spacers 1014. In some examples, the inner spacers 1014 fill the first gaps 810. In some embodiments, the inner spacer layer 910 is removed by a dry etching process, a wet etching process, and/or a combination thereof. In some embodiments, the inner spacers 1014 provide an etch stop layer during subsequent processing.

Figure 11:
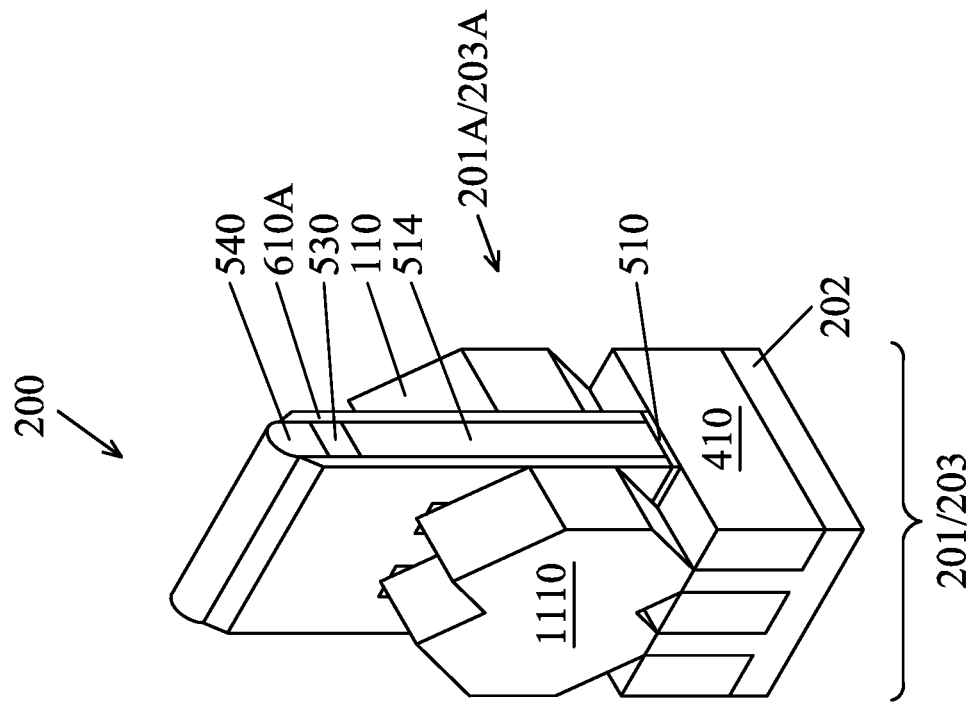

Referring to FIGS. 1 and 11, the process 100 proceeds to S120 by forming S/D features 1110, such as S/D features 1110 shown in the first region 201 and the second region 203. In some embodiments, the S/D features 1110 are configured to form respective S/D terminals to the first and second transistors 201A and 203A. In some embodiments, the S/D features 1110 are formed by performing an epitaxial growth process that provides an epitaxy material extending from the substrate 202 and covering the upper fins 310A that underlie the dummy gate structure 520. In some embodiments, the S/D features 1110 are formed by epitaxially growing a semiconductor material.

In various embodiments, the epitaxially grown semiconductor material may include Ge, Si, GaAs, AlGaAs, SiGe, GaAsP, SiP, or other suitable material. In some embodiments, the epitaxially grown semiconductor material is in-situ doped during an epitaxial process. For example, the epitaxially grown semiconductor material is doped with boron. In some embodiments, the epitaxially grown semiconductor material is doped with carbon to form Si:C S/D features, phosphorous to form Si:P S/D features, or both carbon and phosphorous to form SiCP S/D features. In an embodiment, the second epitaxial layer 216 is silicon and the epitaxially grown semiconductor material is also silicon. In some embodiments, the second epitaxial layer 216 and the epitaxially grown semiconductor material comprise a similar material, but are differently doped. In other embodiments, the second epitaxy layer 216 includes a first semiconductor material, the epitaxially grown semiconductor material includes a second semiconductor material different than the first semiconductor material. In some embodiments, the epitaxially grown semiconductor material is not in-situ doped, and, for example, an implantation process is performed to dope the epitaxially grown semiconductor material.

Referring to FIGS. 1 and 12, the process 100 proceeds to S122 by forming an inter-layer dielectric (ILD) layer 1210 over the substrate 202, including the first region 201 and the second region 203. In some embodiments, the ILD layer 1210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1210 may be deposited by a PECVD process or other suitable deposition technique. In some embodiments, after formation of the ILD layer 1210, the semiconductor device 200 is subject to a high thermal budget process to anneal the ILD layer 1210.

Referring to FIGS. 1 and 13, the process 100 proceeds to S124 by removing the dummy gate structure 520 to expose the upper fins 310A. In some examples, after depositing the ILD layer 1210, a planarization process is performed to expose a top surface of the dummy gate structure 520. For example, the planarization process includes a CMP process that removes portions of the ILD layer 1210 overlying the dummy gate structure 520 and planarizes a top surface of the semiconductor device 200. In addition, the CMP process removes the HM layer 530 overlying the dummy gate structure 520 to expose the electrode layer 514. Thereafter, in some embodiments, the remaining dummy gate structure 520 is removed from the substrate 202. In some embodiments, the electrode layer 514 is removed while the dummy dielectric layer 510 is not removed. The removal of the dummy gate structure 520 results in a gate trench 1320 illustrated in FIG. 13. The dummy gate structure 520 may be removed using a selective etch process such as a selective wet etch, a selective dry etch, or a combination thereof.

In some embodiments, as shown in FIG. 13, the dummy dielectric layer 510 is removed in the first region 201 and the second region 203. The dummy dielectric layer 510 is removed similarly in many respects to the etching process described above association with FIG. 7. In the present embodiment, the etch process is chosen to selectively etch the dummy dielectric layer 510 without substantially etching the upper fins 310A, the spacer elements 610A, and the STI features 410.

Referring to FIGS. 1, 14A, 14B and 14C, the process 100 proceeds to S126 by removing the second portions 214B of the first epitaxial layers 214 in the gate trenches 1320 in the first and second regions, 201 and 203 to form channel structures 1420 using the remaining second epitaxial layers 216. FIG. 14B illustrates a cross-section corresponding to FIG. 14A along line B-B. The cross-section along line B-B is referred to as channel length cross-section. FIG. 14C illustrates a cross-section corresponding to FIG. 14A along line C-C. The cross-section along line C-C is referred to as channel width cross-section. The second portions 214B of the first epitaxial layers 214 are removed similarly in many respects to the etching process described above association with FIG. 8. FIGS. 14A-14C illustrate second gaps 1410 in place of the removed second portions 214B of the first epitaxial layers 214. The second gaps 1410 are between the adjacent second epitaxy layers 216 in the channel region. The second gaps 1410 may be filled with the ambient environment (e.g., air, nitrogen). As a result, the second epitaxial layers 216 in the gate trench 1320 form the channel structures 1420.

In some embodiments, the channel structure 1420 is referred to as a nanowire or a nanosheet. In some embodiments, the channel structure 1420 is bar-shaped. Referring to FIG. 14C, the channel width cross-section of the channel structure 1420 has an oval shape.

As described above, in some examples, the inner spacers 1014 serve as etch stop layers to protect the S/D features 1110 during removal of the second portions 214B of the first epitaxial layers 214 in the gate trench 1320.

Referring to FIG. 14B, in some embodiments, an additional dielectric layer 1401 is formed above the S/D feature 1110. In some examples, the additional dielectric layer 1401 is formed similarly in many respects to the process described above association with FIG. 6, thus a detailed description is omitted for clarity purposes.

In some embodiments, a final gate structure is subsequently formed over the channel structures 1420. Channels are formed in the respective channel structures 1420 when a suitable voltage is applied to the final gate structure, thus, the final gate structure forms a gate associated with the channels. In some embodiments, the final gate structure includes a gate dielectric layer and a metal gate that includes a plurality of metal layers.

Figures 15A, 15B, 15C:
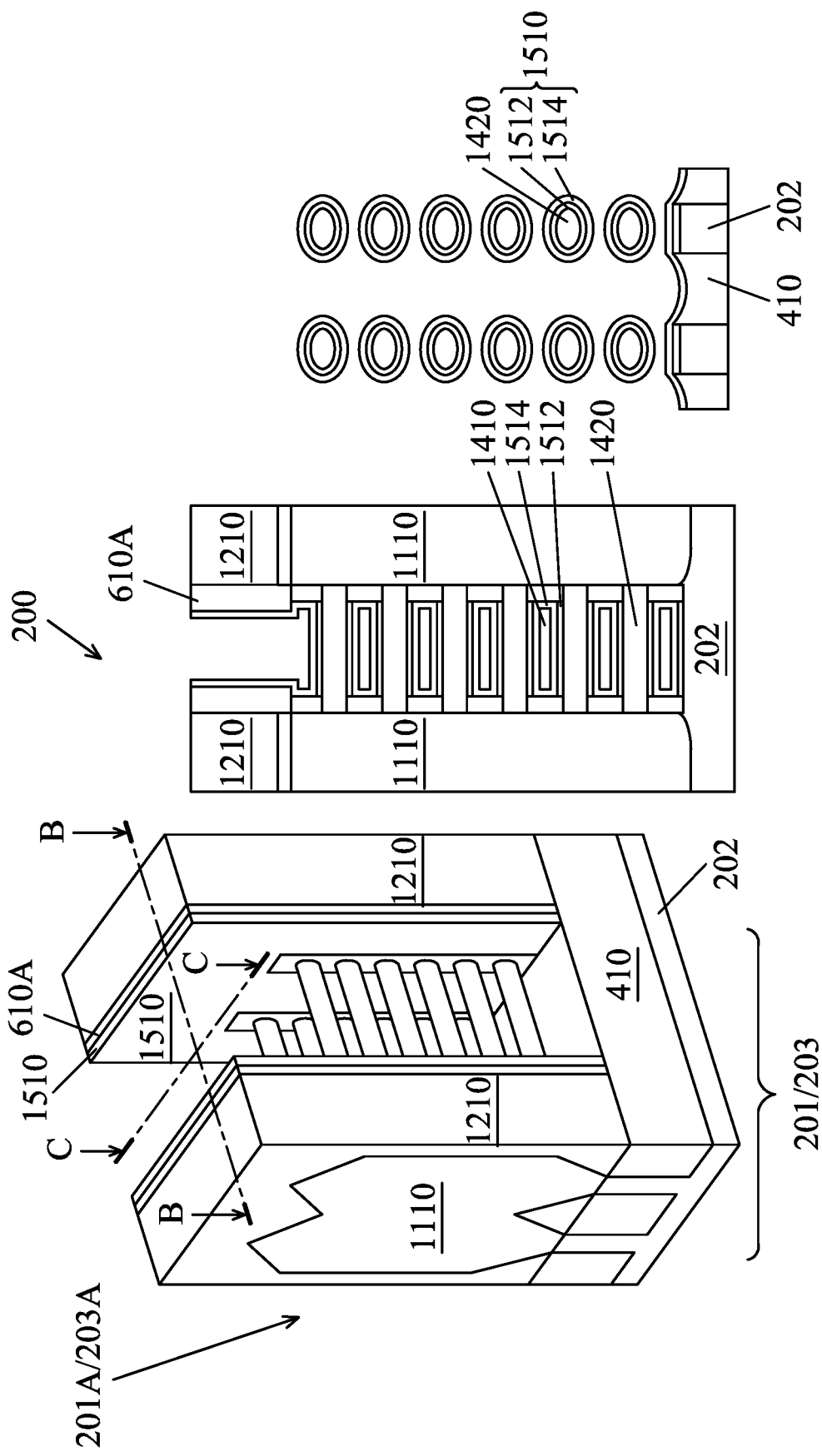
FIG. 15A shows an isometric view of the semiconductor device 200 in accordance with an embodiment of the disclosure.
FIGS. 15B and 15C show cross-section views, corresponding to the isometric view of FIG. 15A along line B-B and line C-C, respectively, of the semiconductor device 200 in accordance with an embodiment of the disclosure.

Referring to FIGS. 1, 15A, 15B and 15C, the process 100 proceeds to S128 by forming a gate dielectric layer 1510 of the final gate structure in the first and second regions, 201 and 203. FIG. 15B illustrates the channel length cross-section corresponding to FIG. 15A along line B-B. FIG. 15C illustrates the channel width cross-section corresponding to FIG. 15A along line C-C. In some embodiments, the gate dielectric layer 1510 includes multiple layers. In an example, the gate dielectric layer 1510 includes an interfacial layer 1512 and a high-K gate dielectric layer 1514. In some embodiments, the interfacial layer 1512 wraps around each channel structure 1420, and the high-K gate dielectric layer 1514 wraps around the respective interfacial layer 1512, as shown in FIGS. 15B and 15C. Note that the second gaps 1410 between the channel structures 1420 are reduced.

In some embodiments, the interfacial layer 1512 includes a dielectric material such as silicon dioxide ($SiO_2$), HfSiO, or silicon oxynitride (SiON). The interfacial layer 1512 is formed by chemical oxidation, thermal oxidation, ALD, CVD, and/or other suitable method. In some embodiments, the high-K gate dielectric layer 1514 includes hafnium oxide ($HfO_2$). The high-K gate dielectric layer 1514 may include other suitable high-K dielectrics, such as TiO, HfaZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some embodiments, the high-K gate dielectric layer 1514 is formed by ALD, PVD, CVD, oxidation, and/or other suitable methods.

Figures 16A, 16B, 16C:
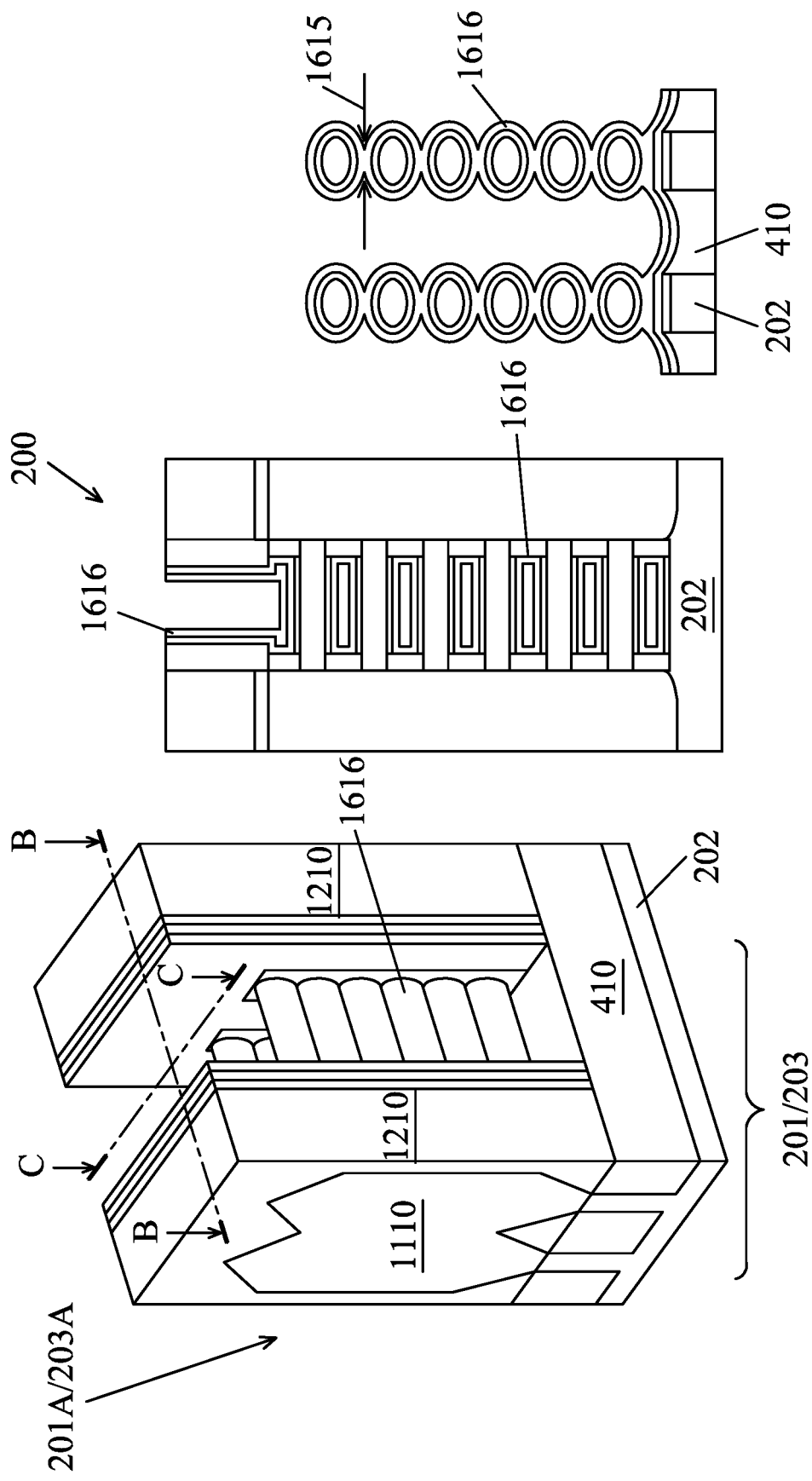
FIG. 16A shows an isometric view of the semiconductor device 200 in accordance with an embodiment of the disclosure.
FIGS. 16B and 16C show cross-section views, corresponding to the isometric view of FIG. 16A along line B-B and line C-C, respectively, of the semiconductor device 200 in accordance with an embodiment of the disclosure.

Referring to FIGS. 1, 16A, 16B and 16C, the process 100 proceeds to S130 by forming a first metal layer 1616 of the metal gate in the final gate structure in the first and second regions, 201 and 203. FIG. 16B illustrates the channel length cross-section corresponding to FIG. 16A along line B-B. FIG. 16C illustrates the channel width cross-section corresponding to FIG. 16A along line C-C. In some embodiments, the first metal layer 1616 includes a mid-gap work function metal, such as TiN, TaSiN, TaN, or a combination thereof. In some embodiments, the first metal layer 1616 wraps around the gate dielectric layer 1510 and fills the second gaps 1410 between the adjacent channel structures 1420, as shown in FIGS. 16B and 16C.

In various embodiments, the first metal layer 1616 may be formed by ALD, PVD, CVD, e-beam evaporation, or other suitable process. In some embodiments, after the first metal layer 1616 is formed, the semiconductor device 200 is annealed, for example, to improve the quality of the first metal layer 1616.

Referring to FIGS. 1, 17A, 17B and 17C, the process 100 proceeds to S132 by removing a portion of the first metal layer 1616 in the first and second regions, 201 and 203. FIG. 17B illustrates the channel length cross-section corresponding to FIG. 17A along line B-B. FIG. 17C illustrates the channel width cross-section corresponding to FIG. 17A along line C-C. According to an embodiment of the disclosure, the remaining first metal layer forms a plurality of metal caps 1616A between adjacent channel structures 1420.

In some embodiments, as illustrated in FIG. 17C, the channel width cross section of each of the channel structures 1420 has an oval shape, for example, due to the process 100. For example, the removal of the first 214A and/or second portions 214B of the first epitaxy layers 214 and/or high-K dielectric deposition processes round edges of the channel structures 1420. In some examples, the channel width cross-section has an oval shape where a longest part of the oval shape is substantially parallel to the substrate 202, and a shortest part of the oval shape is substantially perpendicular to the substrate 202.

Further, in the example shown in FIG. 17C, the channel width cross-section of the metal cap 1616A along line C-C is substantially narrower than the respective channel width cross-section of the channel structure 1420, thus the channel width cross section of the metal cap 1616A is referred to have a pillar or column shape. In various embodiments, the metal cap 1616A between adjacent channel structures 1420 does not wrap around the respective channel structure 1420.

According to aspects of the disclosure, the metal caps 1616A between adjacent channel structures 1420 facilitate formation and removal of subsequent metal layers, such as band-edge work function metal layers that are used to respectively determine thresholds of, for example, PFETs and NFETS. In the present disclosure, the metal caps 1616A help fabricating transistors having different threshold voltages, as described below even when spaces between adjacent channel structures 1420 are relatively small.

In some embodiments, the metal caps 1616A are formed by an etch process, such as a wet etch process, a dry etch process, a multiple-step etch process, and/or a combination thereof. Parameters of the etch process are suitably controlled, thus the metal caps 1616A of a desired shape and sizes remain when the other portion of the first metal layer 1616 has been removed. In an example, the parameters of the etch process are pre-determined by design of experiments. In another example, the parameters of the etch process are controlled in response to in situ monitoring results. In an example, the first metal layer 1616 is deposited in the step S130 with a suitably thickness. The thickness can be predetermined such that the width 1615 of the first metal layer 1616 is for example about twice of the thickness. Then, when the etch process in the step S132 is isotropic, the metal caps 1616A remain when the other portion of the first metal layer 1616 has been removed. It is noted that the above example is for illustration, the thickness of the first metal layer 1616 and the width 1615 can be suitably determined by design of experiments.

Figure 18:
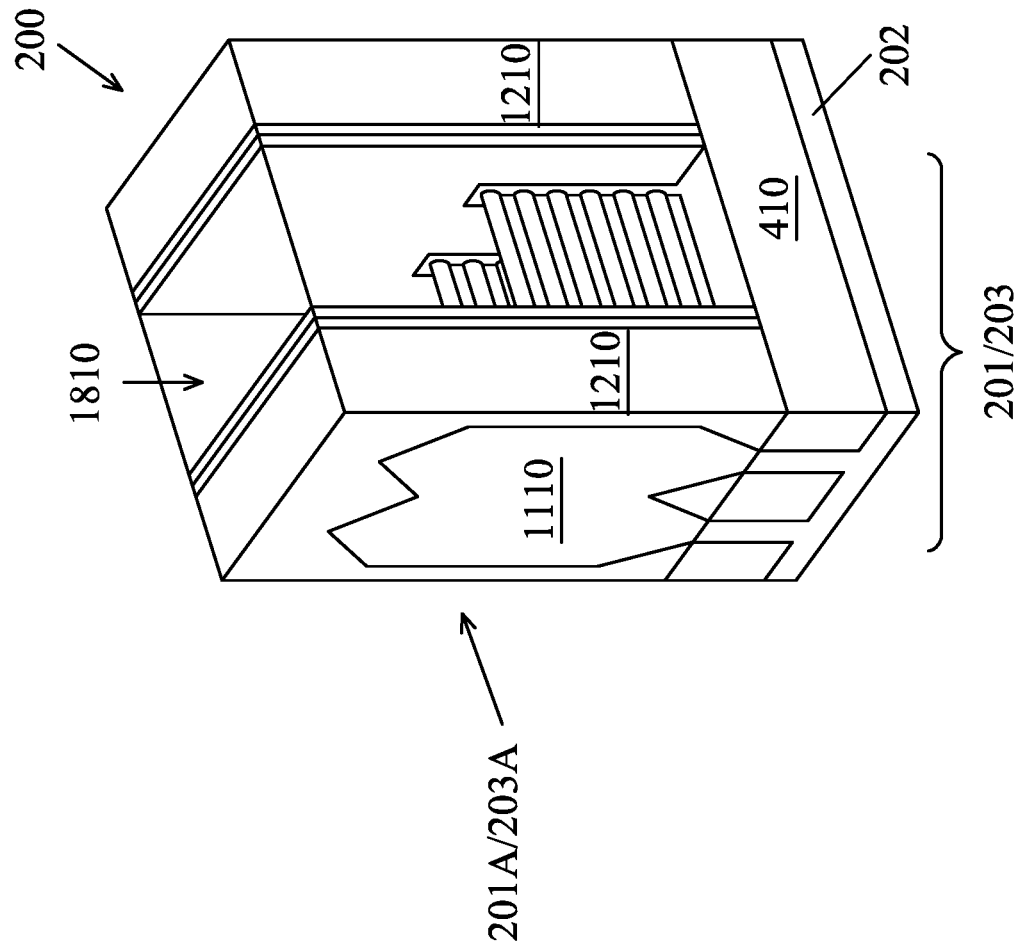
FIG. 18 shows an isometric view of the semiconductor device 200 in accordance with an embodiment of the disclosure.

Referring to FIGS. 1 and 18, the process 100 proceeds to S134 to form a second metal layer 1810 of the metal gate in the final gate structure in the first and second regions, 201 and 203. In some embodiments, the second metal layer 1810 wraps around the gate dielectric layer 1510 and the metal caps 1616A, as shown in FIG. 18. In various embodiments, the second metal layer 1810 may be formed by ALD, PVD, CVD, e-beam evaporation, or other suitable process. In some embodiments, as described above, the second metal layer 1810 include a multi-layer structure, such as various combinations of a work function metal layer, a liner layer, a wetting layer, an adhesion layer, a barrier layer, and the like. By way of example, the second metal layer 1810 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The work function metal layer is suitably selected with a suitable work function. In some embodiments, the second metal layer 1810 includes a band-edge work function metal to determine a threshold voltage of transistors. In an example, the second metal layer 1810 includes a first band-edge work function metal and results in a first threshold voltage $V_{t1}$ of the first transistor 201A in the first region 201.

Figure 19B:
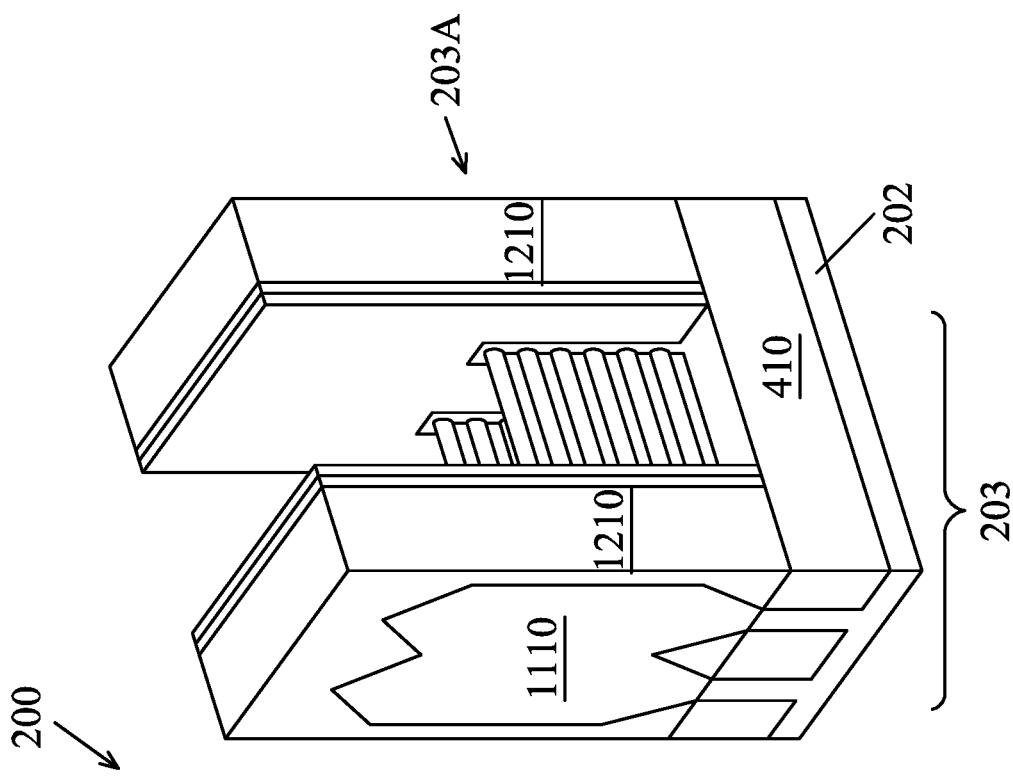
FIGS. 19A and 19B show an isometric view of a first transistor 201A and a second transistor 203A, respectively, in accordance with an embodiment of the disclosure.
Figure 19A:
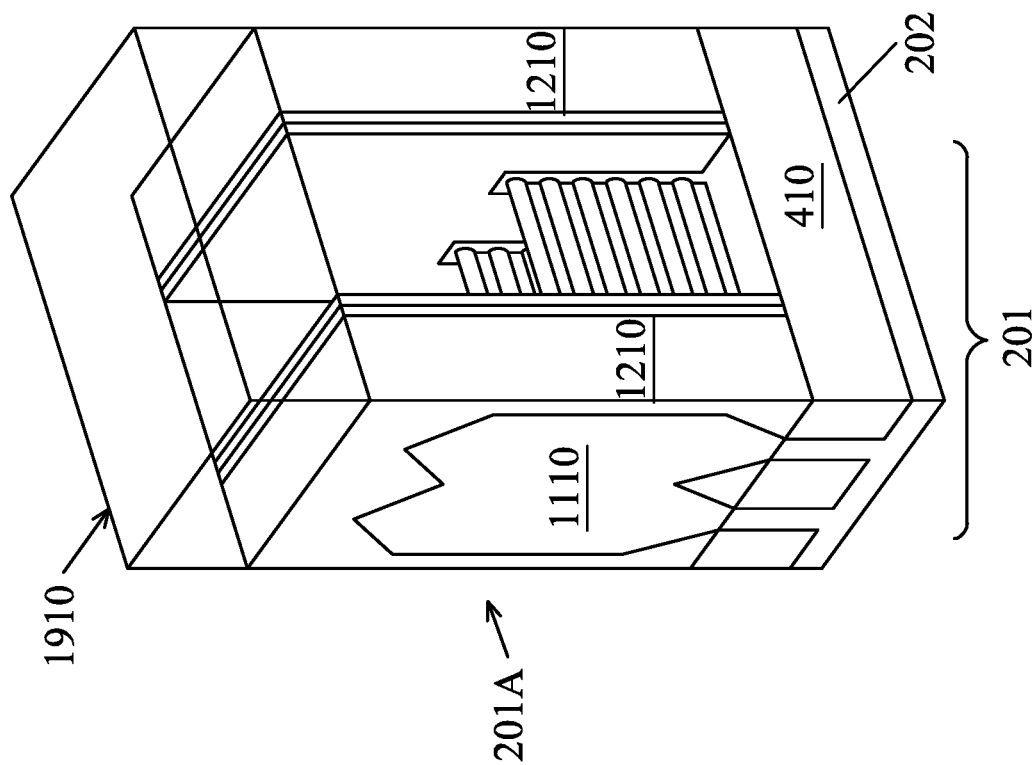

Referring to FIGS. 19A and 19B, the process 100 proceeds to S136 by removing the second metal layer 1810 in the second region 203, while leaving the second metal layer 1810 intact in the first region 201. In some embodiments, prior to removing the second metal layer 1810 in the second region 203, a first patterned HM 1910 is formed to cover the first region 201. In an example, the first patterned HM 1910 includes a patterned photoresist layer and is formed by a lithography process. In another example, the first patterned HM 1910 is formed by depositing a HM material layer, forming a patterned photoresist layer over the HM material layer by a lithography process and etching the HM material layer through the patterned photoresist layer to form the first patterned HM 1910.

In some embodiments, removing the second metal layer 1810 is performed using an etch process, such as a wet etch process, a dry etch process, a multiple-step etch process, and/or a combination thereof. In an example, the second metal layer 1810 is removed from the second region 203 without substantially affecting other structures in the second region 203, such as the gate dielectric layer 1510 and the metal caps 1616A.

Figure 20B:
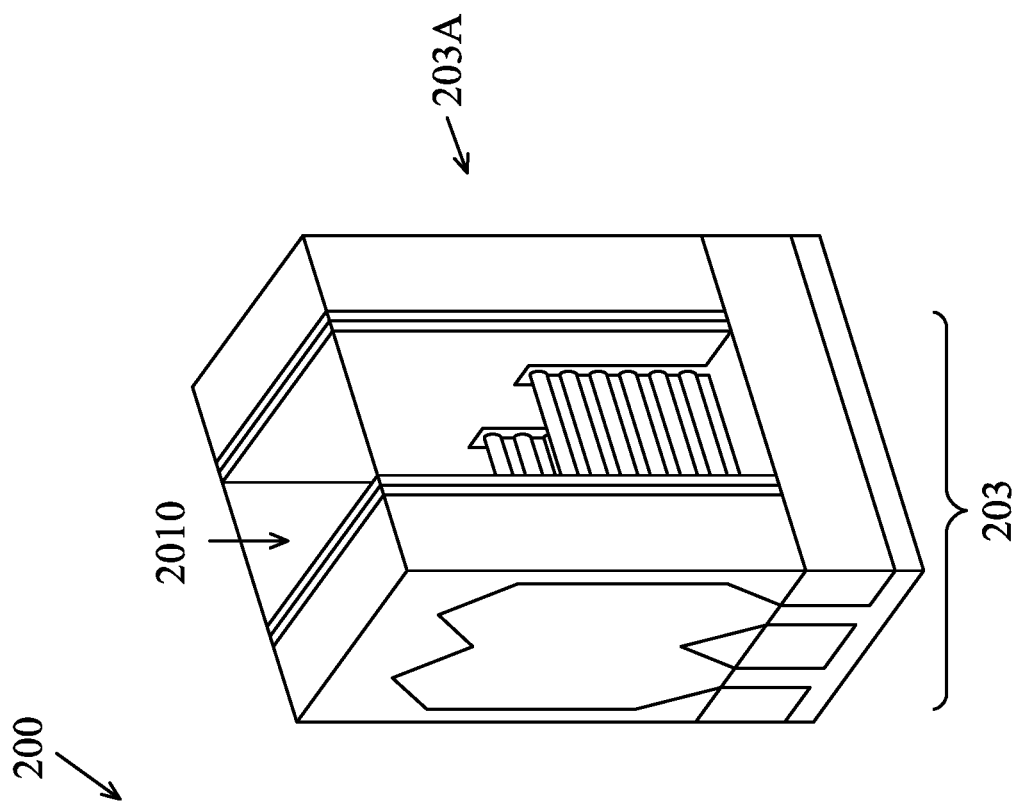
FIGS. 20A and 20B show an isometric view of the first transistor 201A and the second transistor 203A, respectively, in accordance with an embodiment of the disclosure.
Figure 20A:
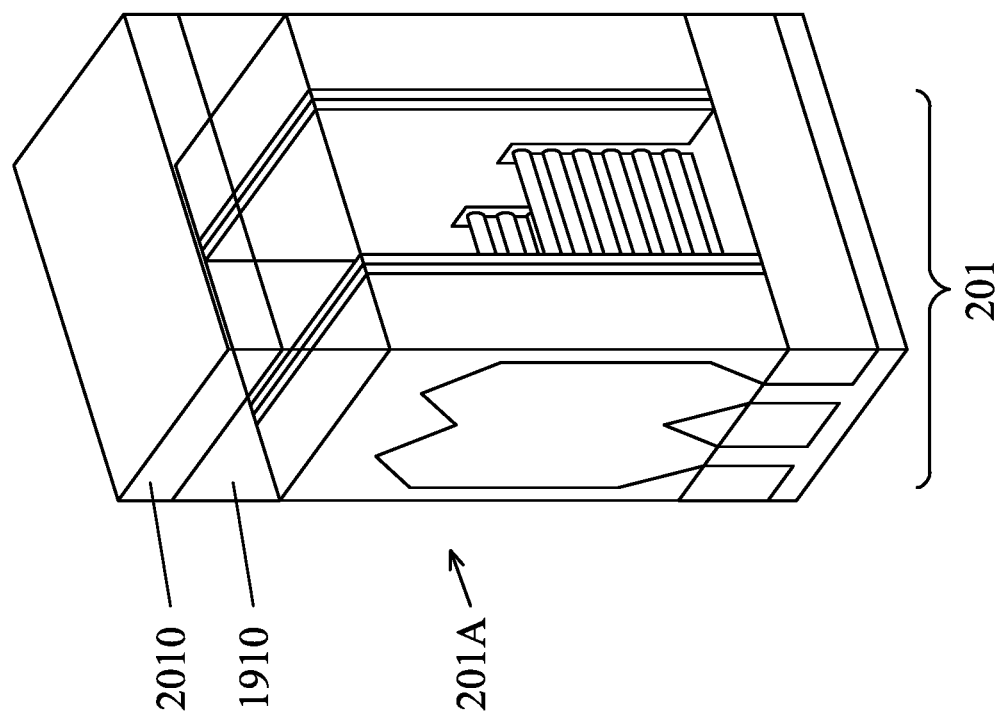

Referring to FIGS. 20A and 20B, the process 100 proceeds to S138 by forming a third metal layer 2010 in the second region 203. The third metal layer 2010 is formed similarly in many respects to the second metal layer 1810 discussed above association with FIG. 18, including the materials discussed therein. In some examples, the third metal layer 2010 wraps around the gate dielectric layer 1510 and the metal caps 1616A in the second region 203. In some embodiments, the third metal layer 2010 includes a second band-edge work function metal, and results in a second threshold voltage $V_{t2}$ of the second transistor 203A in the second region 203. In some examples, the first band-edge work function metal and the second band-edge work function metal are different, and the first threshold voltage $V_{t1}$ of the first transistor 201A and the second threshold voltage $V_{t2}$ in the second transistor 203A are different. In some examples, one of the first transistor 201A and the second transistor 203A is a NFET and the other is a PFET.

Referring to FIGS. 21A and 21B, the process 100 proceeds to S140 by removing an excess third metal layer 2010 in the first and second regions, 201 and 203. Further, the first patterned HM 1910 is removed by an etch process. In one example where the first patterned HM 1910 includes a photoresist pattern, the first patterned HM 1910 is removed by wet stripping and/or plasma ashing. Then the process 100 proceeds to S199 and terminates. It is noted that, other suitable process steps (e.g., back end of line processes), can be subsequently performed on the semiconductor device 200.

FIG. 21C illustrates the channel width cross-section of the first transistor 201A, such as a NFET, in the first region 201 along line C-C. FIG. 21D illustrates the channel width cross-section of the second transistor 203A, such as a PFET, in the second region 203 along line D-D. In some embodiments, the first transistor 201A includes the second metal layer 1810 and the second transistor 203A includes the third metal layer 2010 in the respective final gate structure.

FIG. 21E shows an enlarged cross-sectional view of an area 2101 in FIG. 21D. Note that the metal cap 1616A is between adjacent channel structures 1420 and does not wrap around the respective channel structure 1420. In some embodiments, as shown in FIGS. 21C-E, the metal cap 1616A has a smaller dimension in the channel width cross-section along line C-C or line D-D than the channel structure 1420 in the cross-section. For examples, the channel width cross-section of the metal cap 1616A is substantially narrower than the respective channel width cross-section of the channel structure 1420. In some embodiments, a channel width $D_1$ of the channel structure 1420 is substantially larger than a cap width $D_2$ of the metal cap 1616A. For example, the channel width $D_1$ is between 8 nm and 16 nm, and the cap width $D_2$ is between 2 nm and 8 nm. In some examples, a ratio of the channel width $D_1$ over the cap width $D_2$ is between 1 to 8.

In some embodiments, channel distances $T_2$ between adjacent channel structures are optimized for transistor performance considerations, and the optimized channel distances $T_2$ are relatively small, thus formation and removal of a metal layer between adjacent channel structures is challenging. In some embodiments, the channel distance $T_2$ is between 4 nm and 10 nm. In various embodiments, forming the metal caps 1616A between adjacent channel structures 1420 facilitates formation and removal of a metal layer in a metal gate, thus helps fabricating transistors having different threshold voltages. For example, the metal caps 1616A facilitates formation of the second metal layer 1810 in the first transistor 201A, and facilitates removal of the second metal layer 1810 and formation of the third metal layer 2010 in the second transistor 203A.

In some embodiments, as illustrated in FIG. 21C-21E, the channel width cross section of the channel structures 1420 has an oval shape. In some examples, the oval shape has a longest part of the channel width cross-section parallel to the substrate 202, and a shortest part of the oval shape perpendicular to the substrate 202.

Additional process steps may be implemented before, during, and after process 100, and some process steps described above may be replaced or eliminated in accordance with various embodiments of process 100.

The semiconductor device 200 may undergo further CMOS or MOS technology process flow to form various features and regions known in the art. For example, various contacts/vias and multilayers interconnect features (e.g., interlayer dielectrics) over the substrate 202, configured to connect the various features or structures of the semiconductor device 200.

The present disclosure provides methods of forming channel structures wrapped around by a final gate structure. The method forms metal caps in the final gate structure between adjacent channel structures, thus facilitating formation and removal of metal layers between the closely disposed channel structures. Therefore, forming the metal caps facilitates manufacturing semiconductor devices having transistors with multiple threshold voltages.

Aspects of the disclosure provide a semiconductor device. The semiconductor device includes a first transistor formed in a first region of the semiconductor device. The first transistor includes a first channel structure extending between a source terminal and a drain terminal of the first transistor. The first transistor includes a second channel structure that is stacked on the first channel structure in a vertical direction above a substrate of the semiconductor device. Further, the first transistor includes a first gate structure configured to wrap around the first channel structure and the second channel structure with a first metal cap between the first channel structure and the second channel structure. The first metal cap has a different work function from another portion of the first gate structure.

Aspects of the disclosure provide a method for forming a semiconductor device. The method includes forming a first stack of channel structures that extends between a source terminal and a drain terminal of a first transistor in a first region of the semiconductor device. The first stack of channel structures includes a first channel structure and a second channel structure. The method also includes forming a first gate structure that wraps around the first stack of channel structures with a first metal cap between the first channel structure and the second channel structure. The first metal cap has a different work function from another portion of the first gate structure.

Aspects of the disclosure provide a semiconductor device. The semiconductor device includes a transistor formed on a substrate of the semiconductor device. The transistor includes multiple channel structures that are stacked in a vertical direction above the substrate. The multiple channel structures extend between a source terminal and a drain terminal of the transistor. The transistor includes a gate structure configured to wrap around the multiple channel structures with metal caps between adjacent pairs of the multiple channel structures. The metal caps have a different work function from another portion of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first transistor formed in a first region of the semiconductor device, the first transistor comprising:
        a first channel structure extending between a source terminal and a drain terminal of the first transistor;
        a second channel structure that is stacked on the first channel structure in a vertical direction above a substrate of the semiconductor device; and
        a first gate structure configured to wrap around the first channel structure and the second channel structure with a first metal cap between the first channel structure and the second channel structure, the first metal cap having a different work function from another portion of the first gate structure,
        wherein the first channel structure has a channel width in a first direction parallel to a top surface of the substrate, the first metal cap has a longest cap width between the first channel structure and the second channel structure in the first direction, and the channel width is greater than the longest cap width.

2. The semiconductor device of claim 1, wherein the first gate structure further comprises a first metal layer that has a different work function from the first metal cap.

3. The semiconductor device of claim 1, further comprising:
    a second transistor formed in a second region of the semiconductor device, the second transistor comprising:
        a third channel structure extending between a source terminal and a drain terminal of the second transistor;
        a fourth channel structure that is stacked on the third channel structure in the vertical direction above the substrate; and
        a second gate structure configured to wrap around the third channel structure and the fourth channel structure with a second metal cap between the third channel structure and the fourth channel structure, the second metal cap having a different work function from another portion of the second gate structure.

4. The semiconductor device of claim 3, wherein the first metal cap and the second metal cap have a substantially same work function.

5. The semiconductor device of claim 4, wherein the first channel structure includes a channel material, the first gate structure comprises a first metal layer that has a first work function, and the second gate structure comprises a second metal layer that has a second work function, and wherein the first work function is closer to a valence band edge of the channel material than the second work function, and the second work function is closer to a conduction band edge of the channel material than the first work function.

6. The semiconductor device of claim 1, wherein the first metal cap has a mid-gap work function with regard to a bandgap of a channel material in the first channel structure.

7. The semiconductor device of claim 6, wherein the first metal cap includes at least one of: titanium nitride, tantalum silicon nitride, or tantalum nitride.

8. The semiconductor device of claim 1, wherein the first channel structure has an oval shape in a channel width cross-section.

9. The semiconductor device of claim 1, wherein the first gate structure comprises:
    an interfacial layer wrapping around the first channel structure and the second channel structure;
    a high-K gate dielectric layer wrapping around the interfacial layer; and
    a first metal layer wrapping around the high-K gate dielectric layer and the first metal cap, wherein opposite sidewalls of the first metal cap are in direct contact with the first metal layer, a top surface and a bottom surface of the first metal cap are in direct contact with the high-K gate dielectric layer.

10. A semiconductor device, comprising:
    a transistor that is formed on a substrate of the semiconductor device, the transistor comprising:
        multiple channel structures that are stacked in a vertical direction above the substrate, the multiple channel structures extending between a source terminal and a drain terminal of the transistor; and
        a gate structure configured to wrap around the multiple channel structures with metal caps between adjacent pairs of the multiple channel structures and metal layers wrapping around the multiple channel structures and the metal caps, the metal caps having a different work function from the metal layers of the gate structure,
        wherein an interface between each of the metal caps and each of the metal layers is directly between adjacent pairs of the multiple channel structures and extends along a direction parallel to the vertical direction.

11. The semiconductor device of claim 10, wherein each of the metal caps includes at least one of: titanium nitride, tantalum silicon nitride, or tantalum nitride.

12. A semiconductor device, comprising:
- a substrate;
- a first stack of channel structures extending between a source terminal and a drain terminal of a first transistor over the substrate, wherein the first stack of channel structures includes a first channel structure and a second channel structure; and
- a first gate structure wrapping around the first stack of channel structures with a first metal cap between the first channel structure and the second channel structure,
- wherein the first channel structure has a channel width in a first direction parallel to a top surface of the substrate, the first metal cap has a longest cap width between the first channel structure and the second channel structure in the first direction, and the channel width is greater than the longest cap width.

13. The semiconductor device of claim 12, wherein the first gate structure comprises an interfacial layer wrapping around the first channel structure and a high-K gate dielectric layer wrapping around the interfacial layer.

14. The semiconductor device of claim 13, wherein the first gate structure comprises a first metal layer wrapping around the high-K gate dielectric layer and the first metal cap.

15. The semiconductor device of claim 14, wherein the first metal layer is separated from the first channel structure by the interfacial layer and the high-K gate dielectric layer.

16. The semiconductor device of claim 12, wherein the first channel structure has an oval shape in a channel width cross-section.

17. The semiconductor device of claim 16, wherein the oval shape has a longest part of the channel width cross-section parallel to the substrate and a shortest part of the channel width cross-section perpendicular to the substrate.

18. The semiconductor device of claim 16, wherein a channel distance between the first channel structure and the second channel structure is larger than a shortest part of the channel width cross-section of the oval shape perpendicular to the substrate.

19. The semiconductor device of claim 12, wherein a channel distance between the first channel structure and the second channel structure is larger than a cap length of the first metal cap perpendicular to the substrate.

20. The semiconductor device of claim 12, wherein the first metal cap has a mid-gap work function with regard to a bandgap of a channel material in the first channel structure.

* * * * *